Figure 4:
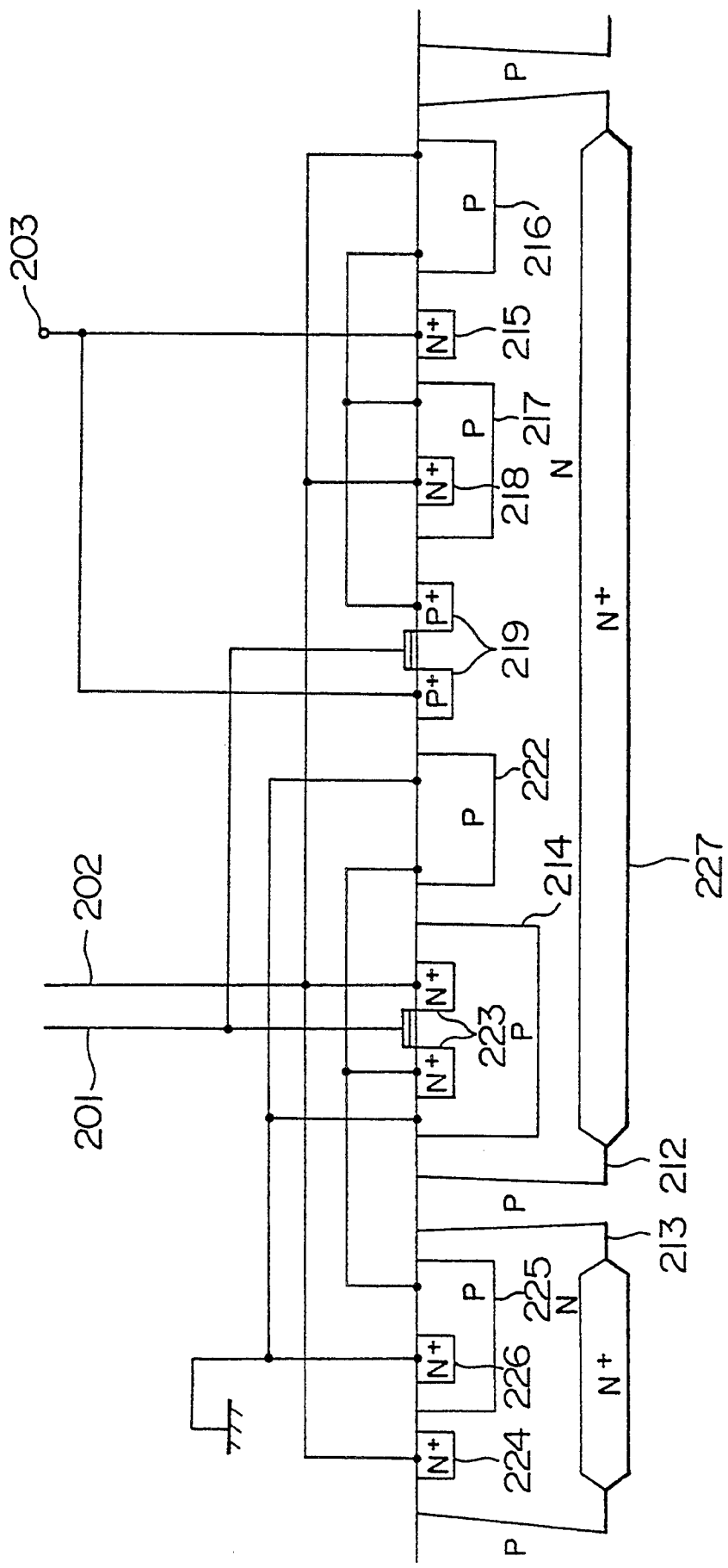

United States Patent [19]
Nishio et al.

[11] Patent Number: 5,378,941
[45] Date of Patent: Jan. 3, 1995

[54] BIPOLAR TRANSISTOR MOS TRANSISTOR HYBRID SEMICONDUCTOR INTEGRATED CIRCUIT DEVICE

[75] Inventors: Yoji Nishio; Ikuro Masuda, both of Hitachi; Kazuo Kato, Ibaraki; Shigeo Kuboki, Nakaminato; Masahiro Iwamura, Hitachi, all of Japan

[73] Assignee: Hitachi, Ltd., Tokyo, Japan

[21] Appl. No.: 983,467

[22] Filed: Nov. 30, 1992

Related U.S. Application Data

[63] Continuation of Ser. No. 462,986, Jan. 10, 1990, abandoned, which is a continuation of Ser. No. 132,671, Dec. 11, 1987, abandoned, which is a continuation of Ser. No. 600,965, Apr. 16, 1984, abandoned.

[30] Foreign Application Priority Data

Apr. 15, 1983 [JP] Japan .................................. 58-67470

[51] Int. Cl.⁶ ..................... H03K 19/02; H03K 19/08; H03K 19/084
[52] U.S. Cl. .................................. 307/446; 307/451; 307/570
[58] Field of Search ............... 307/270, 443, 445, 446, 307/451, 468, 469, 570

[56] References Cited

U.S. PATENT DOCUMENTS 3,541,353 11/1970 Seelbach et al. ..................... 307/446
4,558,234 12/1985 Suzuki et al. ......................... 307/446

FOREIGN PATENT DOCUMENTS 0099100 1/1984 European Pat. Off. ............. 307/446

Primary Examiner—Sara W. Crane
Attorney, Agent, or Firm—Antonelli, Terry, Stout & Kraus

[57] ABSTRACT

A high speed and low power consumption semiconductor integrated circuit device has a plurality of internal circuits each including circuit elements for performing a desired circuit operation, a plurality of input circuits for receiving external input signals and supplying the signals to the internal circuits and a plurality of output circuits for receiving the output signals from the internal circuits and supplying signals to an external circuit. Each of the internal circuits is primarily constructed by bipolar transistors and MOS transistors, and at least one of each of the input circuits and each of the output circuits is primarily constructed by bipolar transistors.

12 Claims, 30 Drawing Sheets

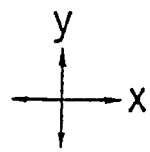
FIG. 1
PRIOR ART
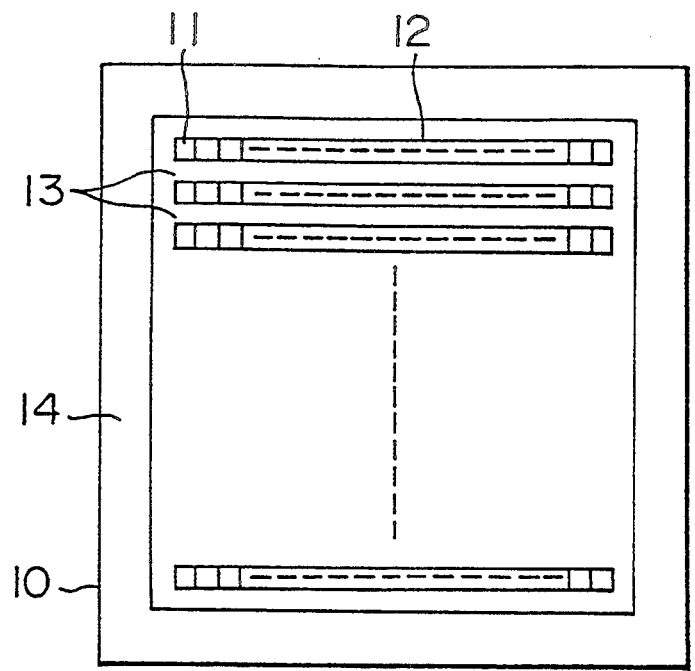
FIG. 2
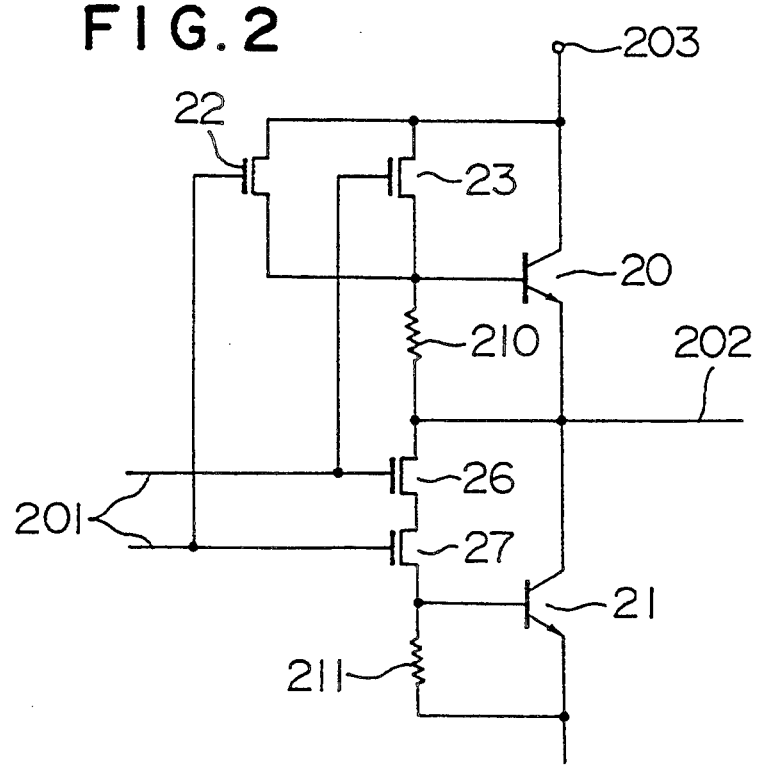

F I G. 3
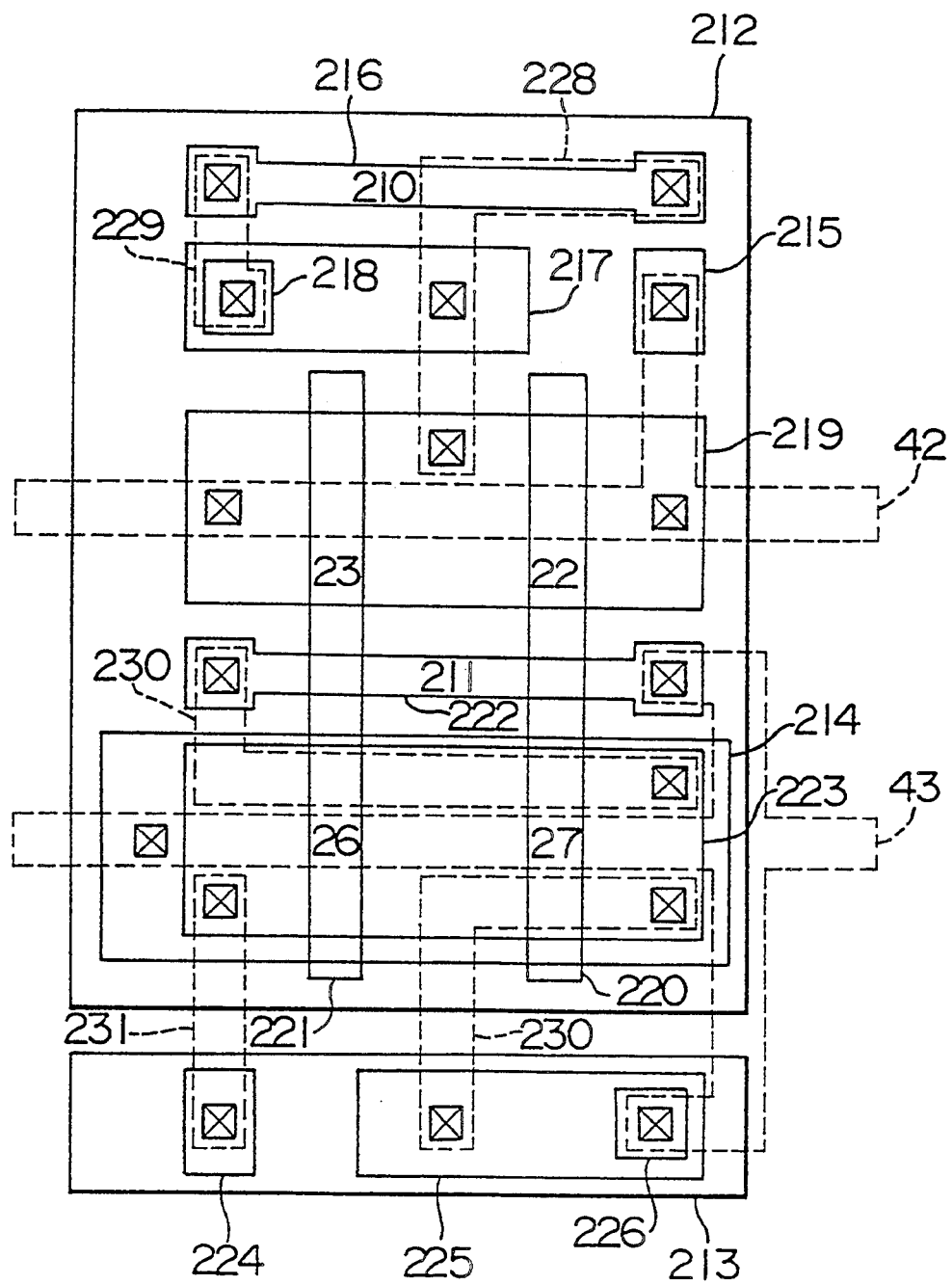

F I G. 10
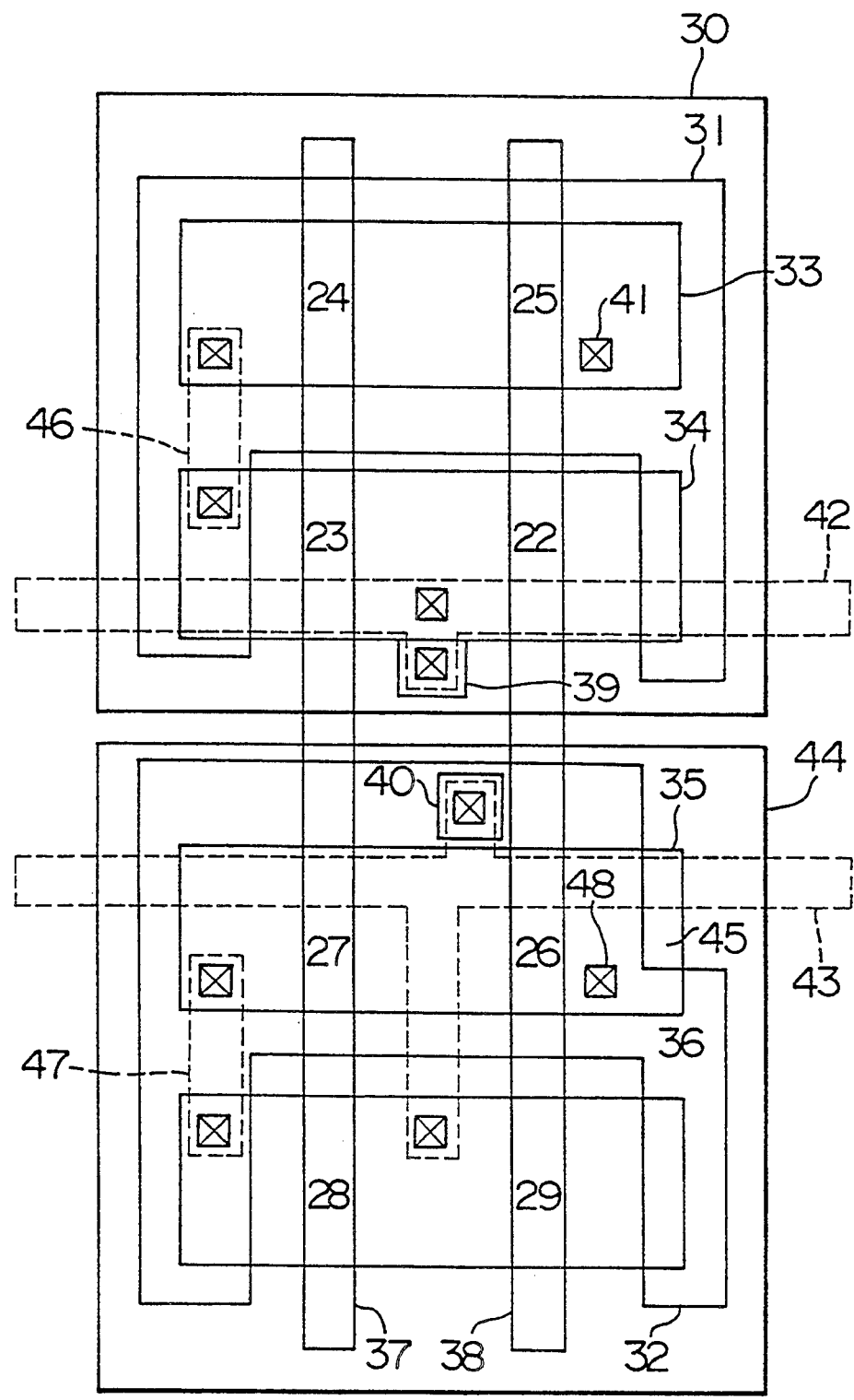

BIPOLAR TRANSISTOR MOS TRANSISTOR HYBRID SEMICONDUCTOR INTEGRATED CIRCUIT DEVICE

This is a continuation of application Ser. No. 462,986, filed Jan. 10, 1990, abandoned, which is a continuation of application Ser. No. 132,671 filed Dec. 11, 1987, abandoned, which is a continuation of application Ser. No. 600,965 filed Apr. 16, 1984, abandoned.

The present invention relates to a semiconductor integrated circuit, and more particularly to a high speed and low power consumption semiconductor integrated circuit device including MOS transistors and bipolar transistors.

In a gate array LSI, which is a type of semiconductor integrated circuit device, only those masks of ten or more photomasks used to manufacture the LSI which correspond to the wiring patterns are prepared in accordance with a type to be developed so that the LSI having a desired electric circuit operation is manufactured. This master-slice concept is said to have existed since the generation of 1960.

A general construction of a gate array LSI is shown in FIG. 1. In this figure, a semiconductor substrate 10 has an area 14 for bonding pads and input/output circuits on an outer periphery thereof. Basic cells 11 comprising transistors are arranged in an x-direction to form basic cell lines 12, which are repeatedly arranged in a y-direction leaving wiring areas 13 therebetween. In order to attain a desired electrical circuit operation, one to several adjacent basic cells 11 are connected to form each internal circuit such as a NAND gate or a flip-flop. Various logical gates each comprising a plurality of basic cells 11 are connected in accordance with a logical diagram to form a single LSI. An input/output circuit may comprise independent input circuit and output circuit or a combined input and output circuit.

In a prior art CMOS gate array LSI, the basic cell 11 comprises CMOS transistors. The internal circuit comprising the CMOS transistors has a low power consumption, but because of a low mutual conductance of the MOS transistor, it takes a long discharge time when a load capacitance is large and hence an operating speed of the circuit is low.

In a prior art bipolar gate array LSI, the basic cell 11 comprises bipolar transistors and resistors. The internal circuit comprising the bipolar transistors has a high operating speed even for a high load capacitance because a mutual conductance of the bipolar transistor is larger than that of the MOS transistor but it has a high power consumption because a large current is flown into and out of a low impedance circuit.

Japanese Laid-Open Patent Application No. 57-181152 discloses a master-slice semiconductor integrated circuit device in which each unit circuit cell comprises MOS transistors and each input/output circuit comprises bipolar transistors and MOS transistors. However, since the internal circuits which occupy most portions of a semiconductor substrate comprise the MOS transistors, it takes a long charge-discharge time when the load capacitance is high and hence the operating speed thereof is low.

It is an object of the present invention to provide a high speed and low power consumption semiconductor integrated circuit device which resolves the problems encountered in the prior art devices.

In order to achieve the above object, the semiconductor integrated circuit device of the present invention is characterized in that each internal circuit portions driving high loads are primarily constructed of bipolar transistors and MOS transistors, which internal circuit portions driving low loads constructed of MOS transistors without bipolar transistors.

Figure 5:
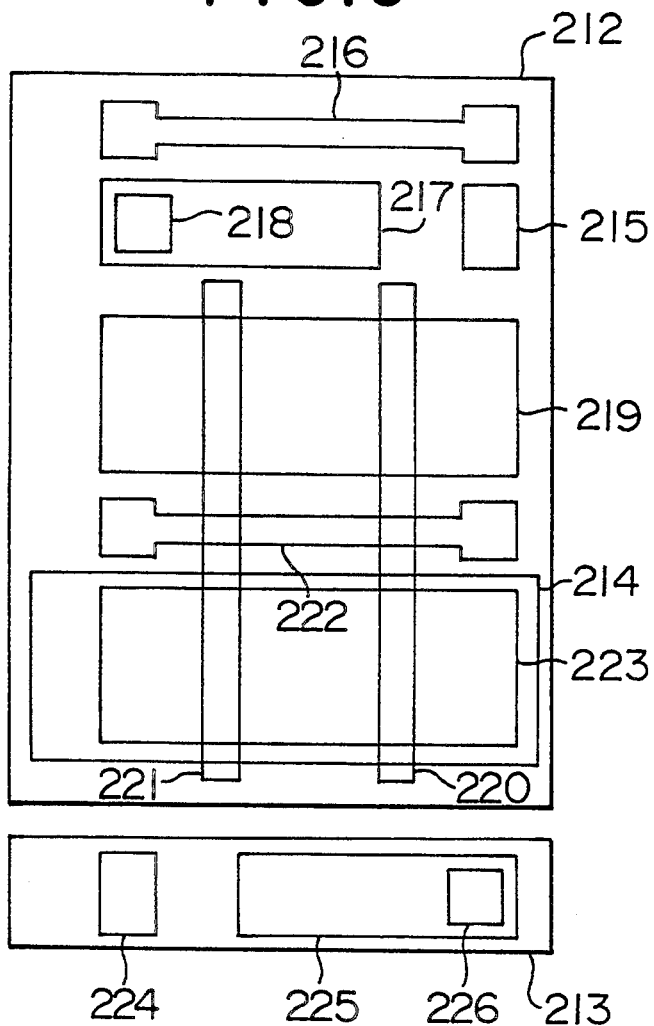
Figure 6:
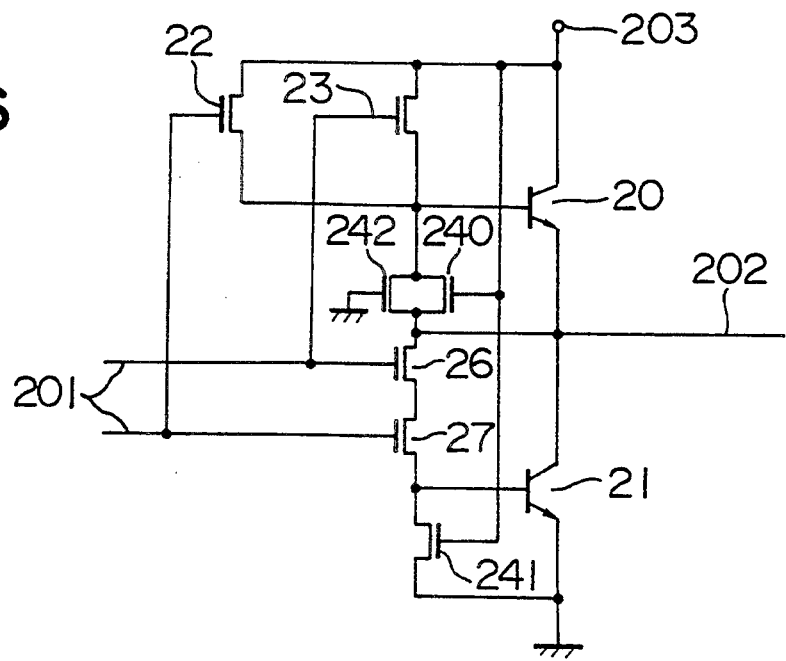
Figure 7:
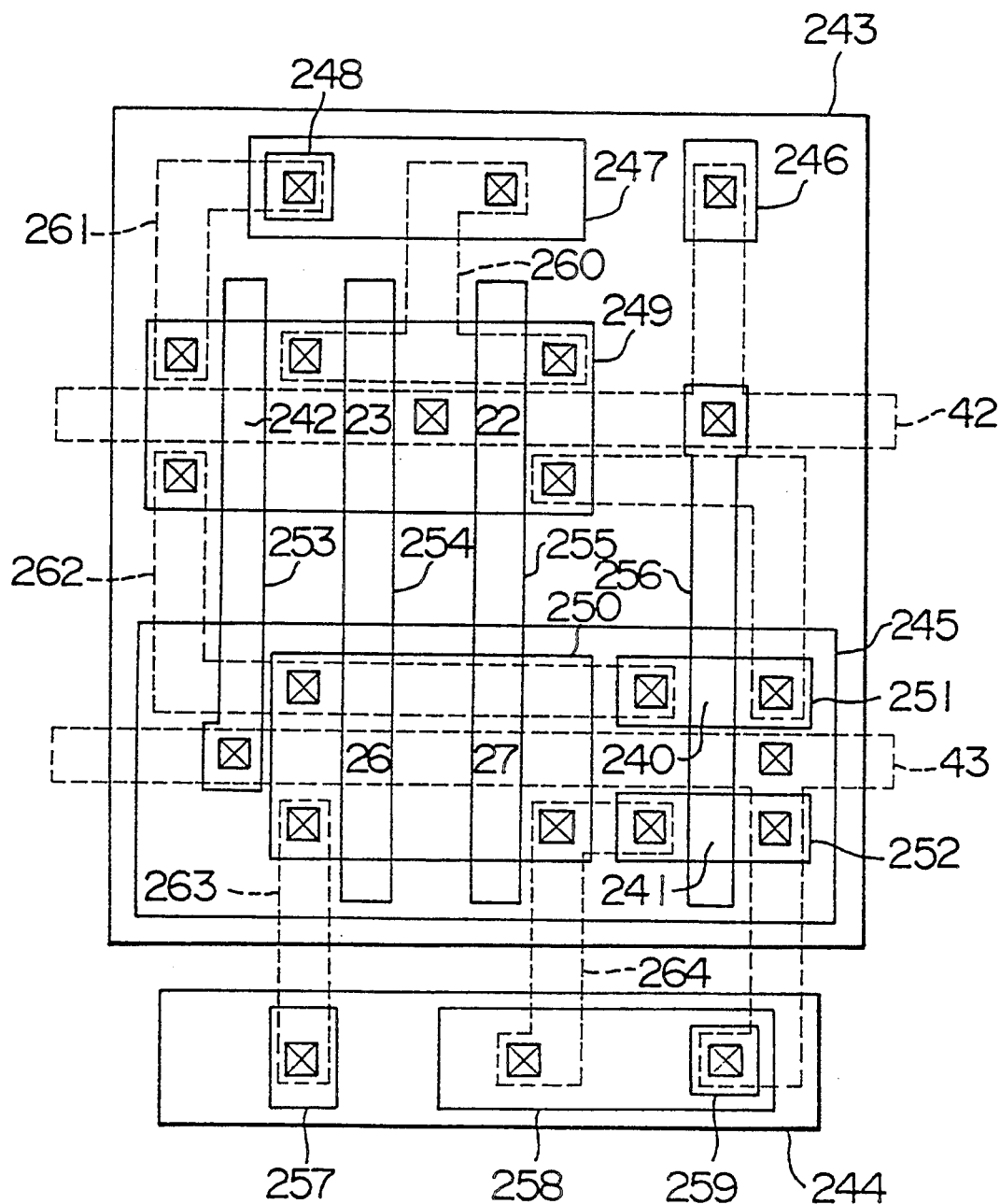
Figure 8:
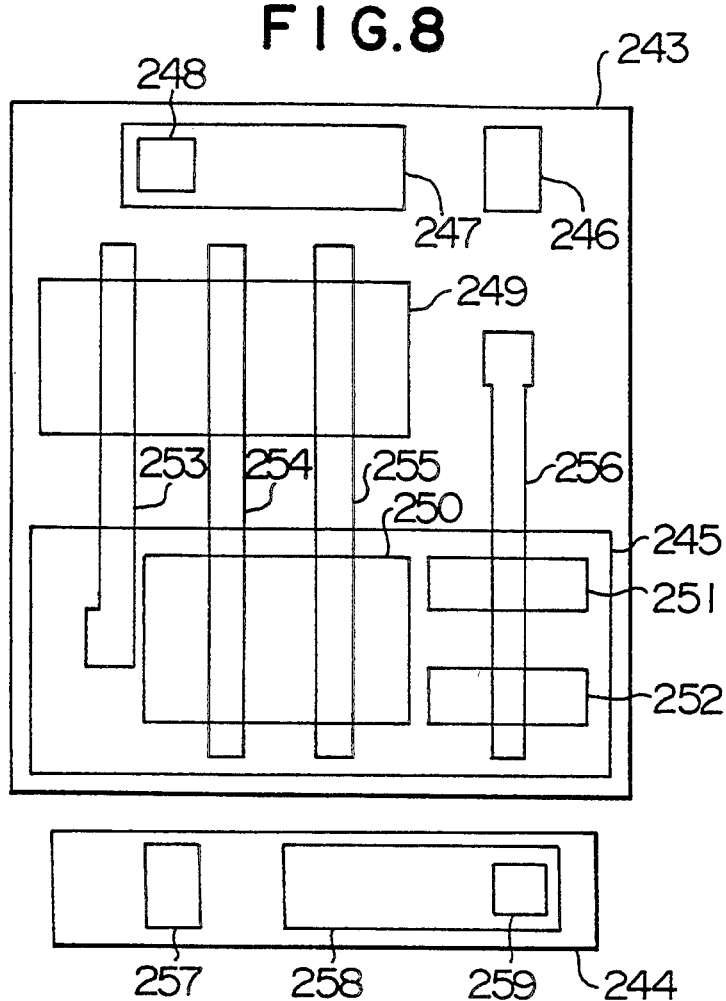
Figure 9:
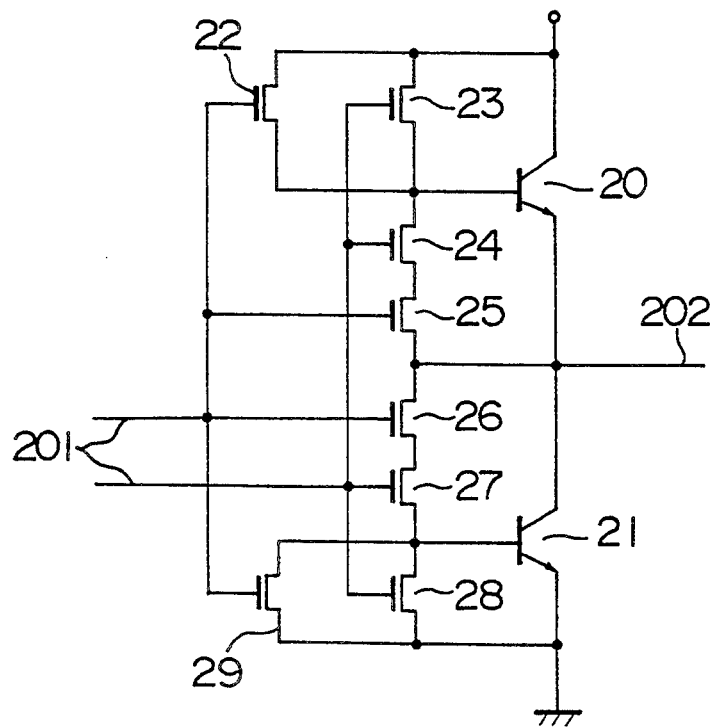
Figure 11:
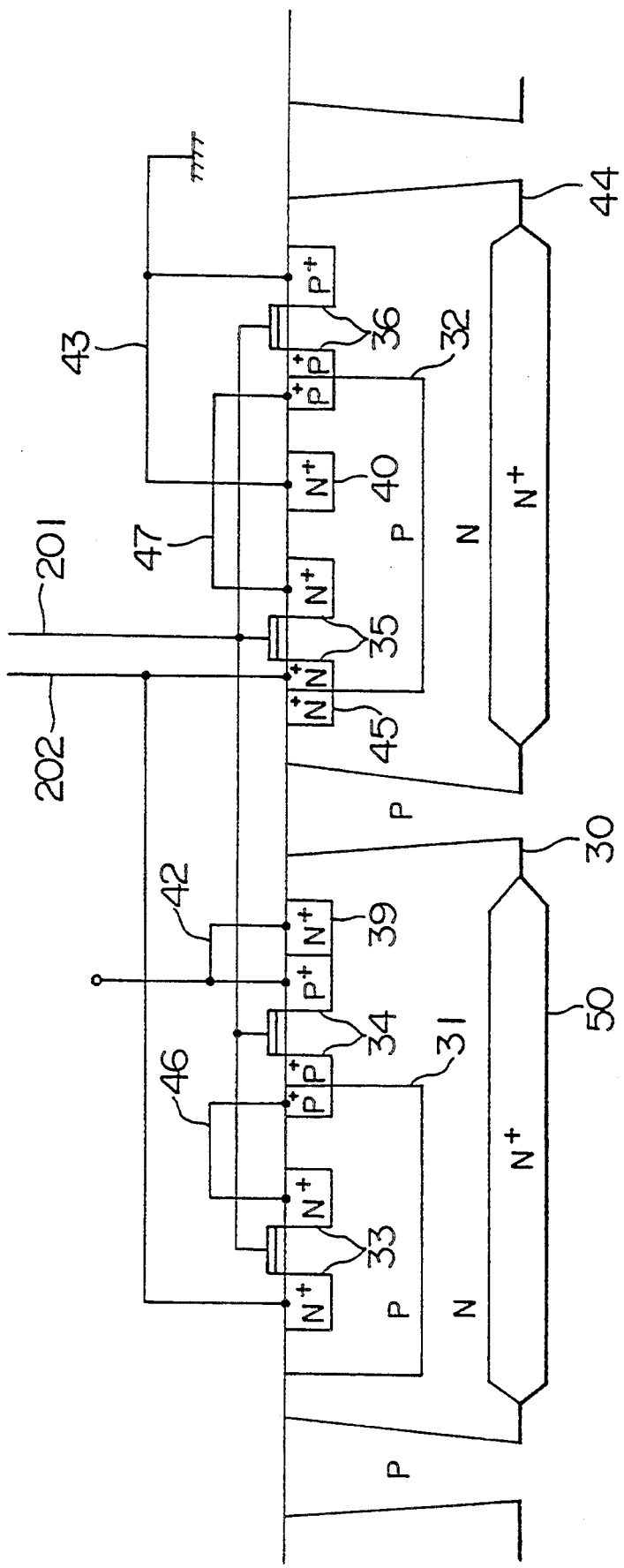
Figure 12:
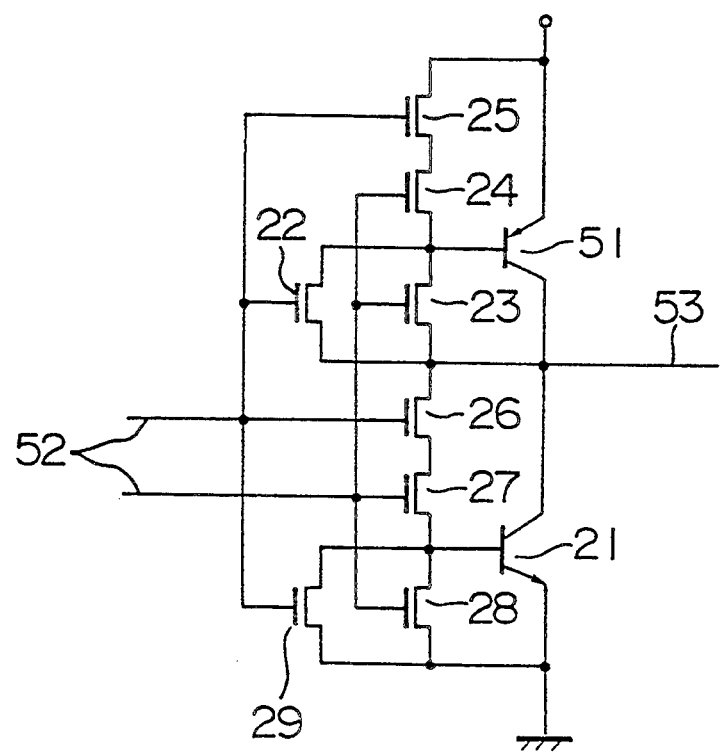
Figure 13:
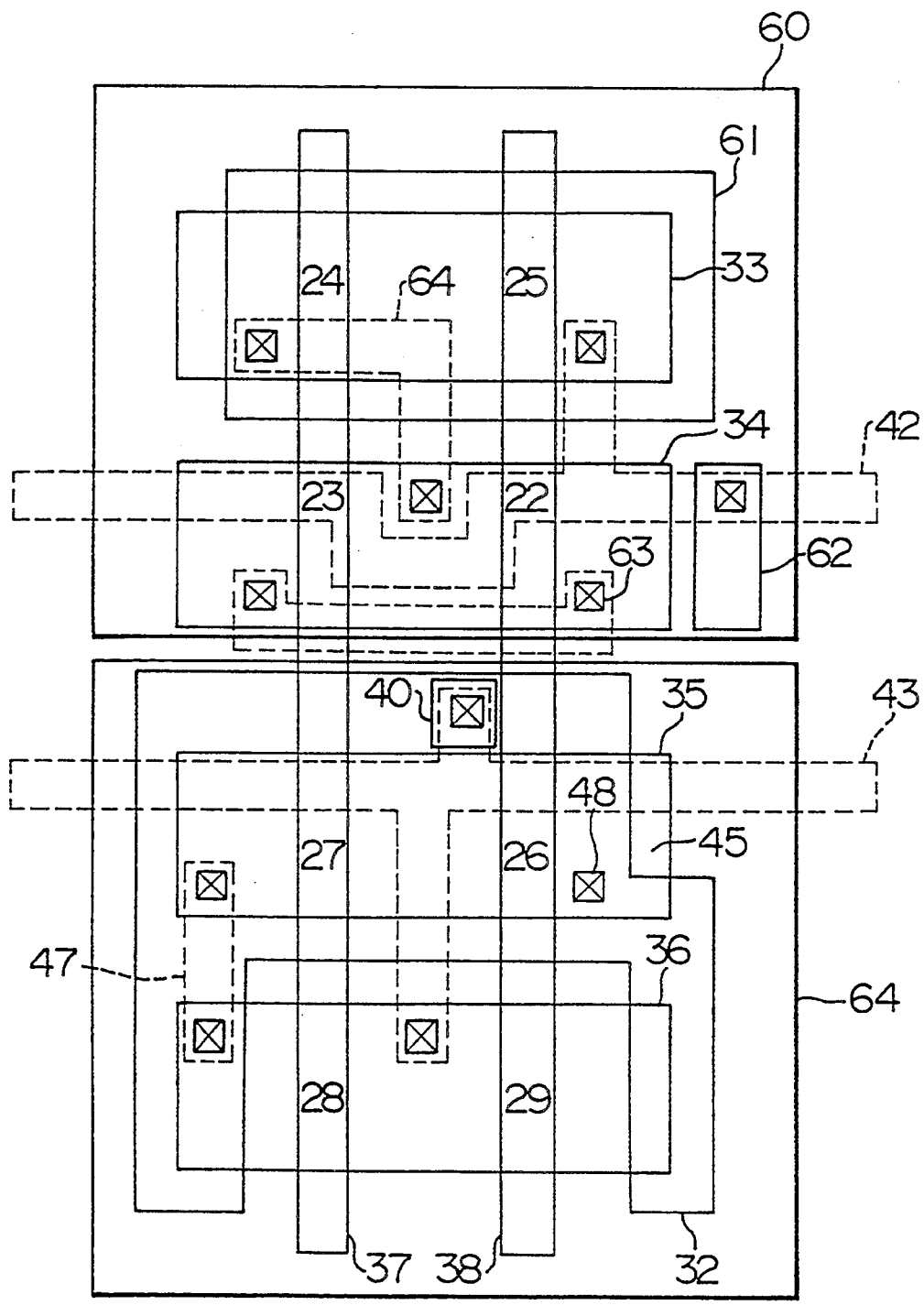
Figure 14:
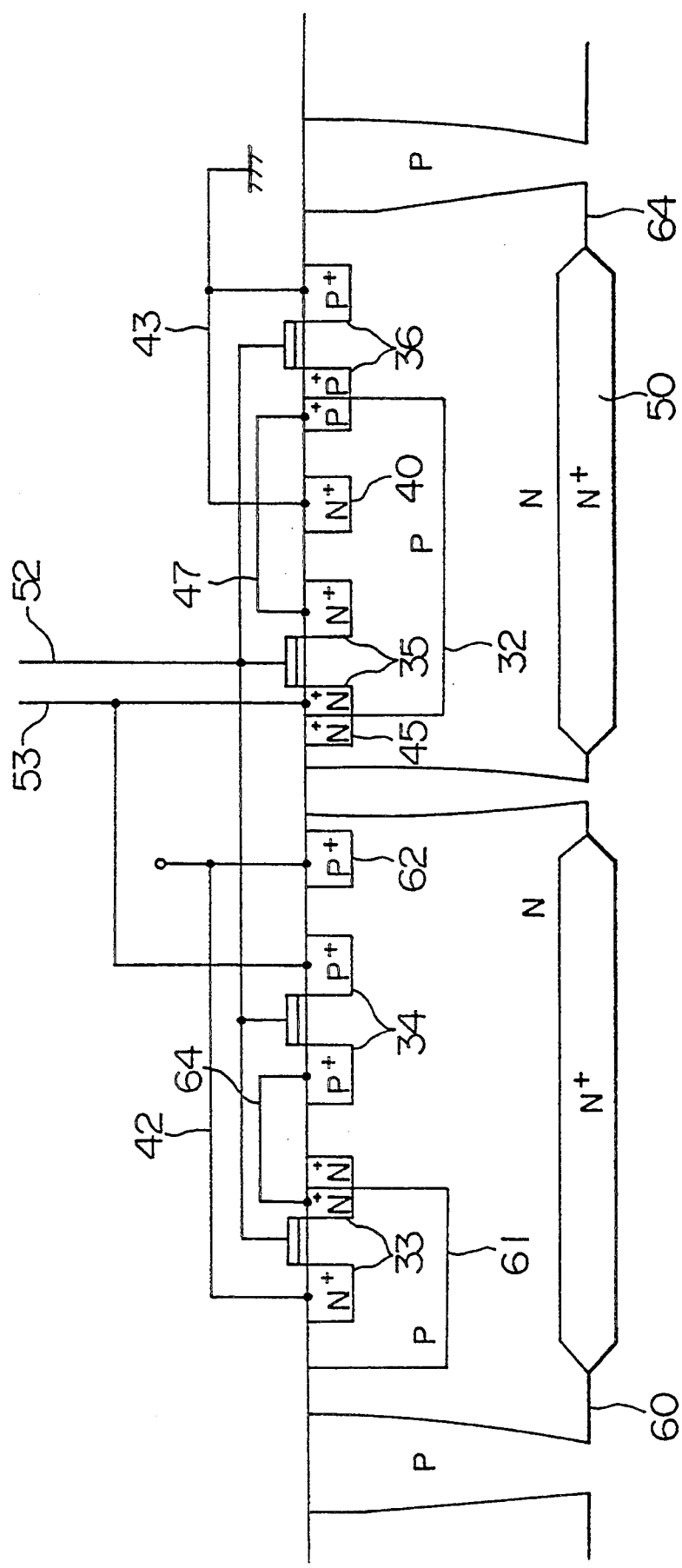
Figure 15:
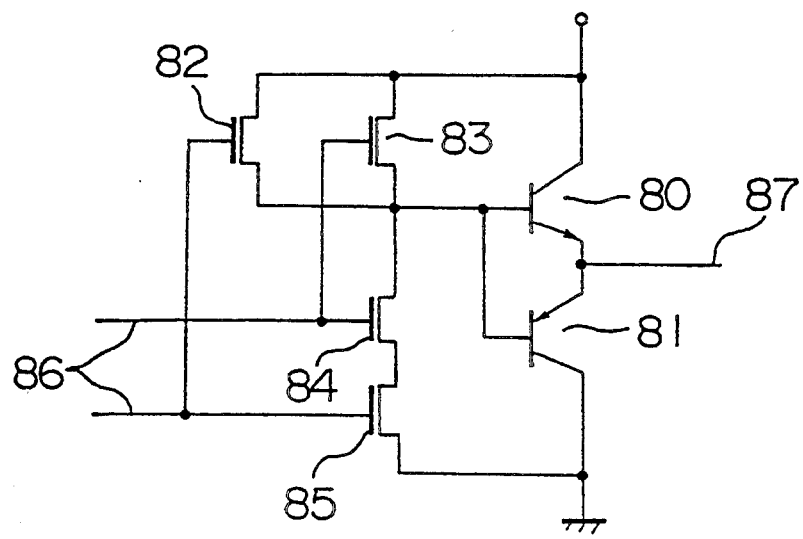
Figure 16:
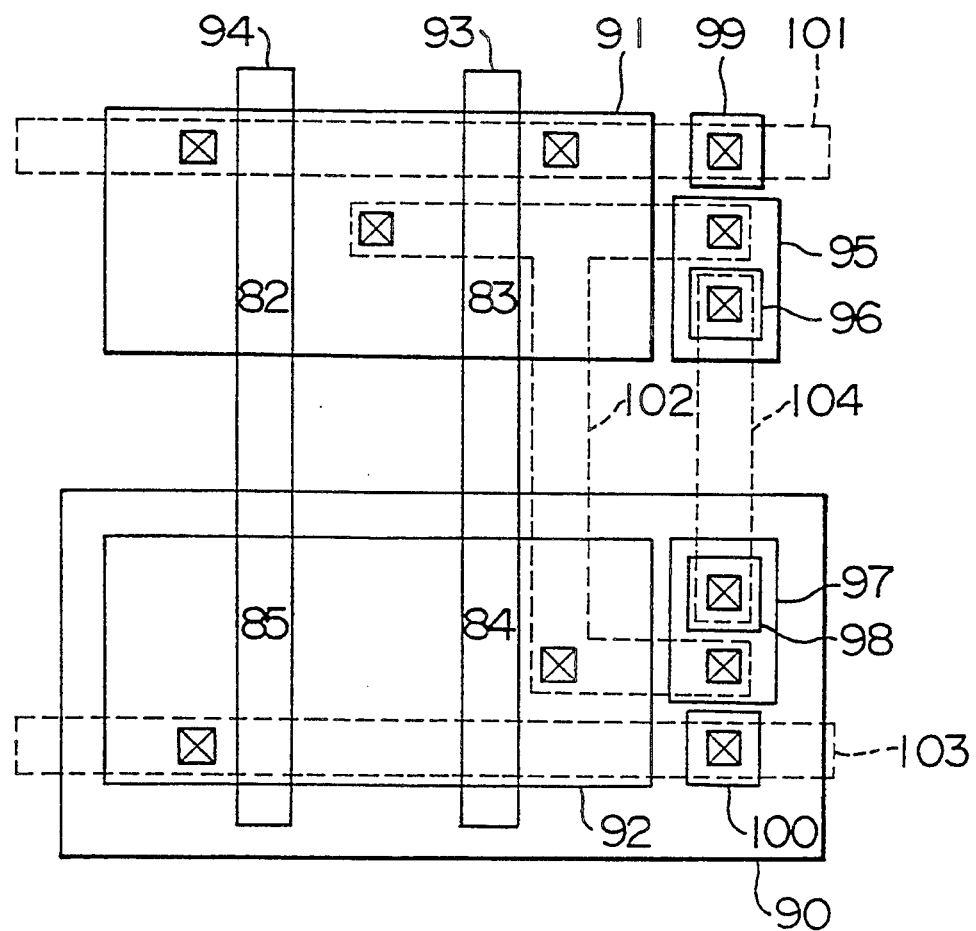
Figure 17:
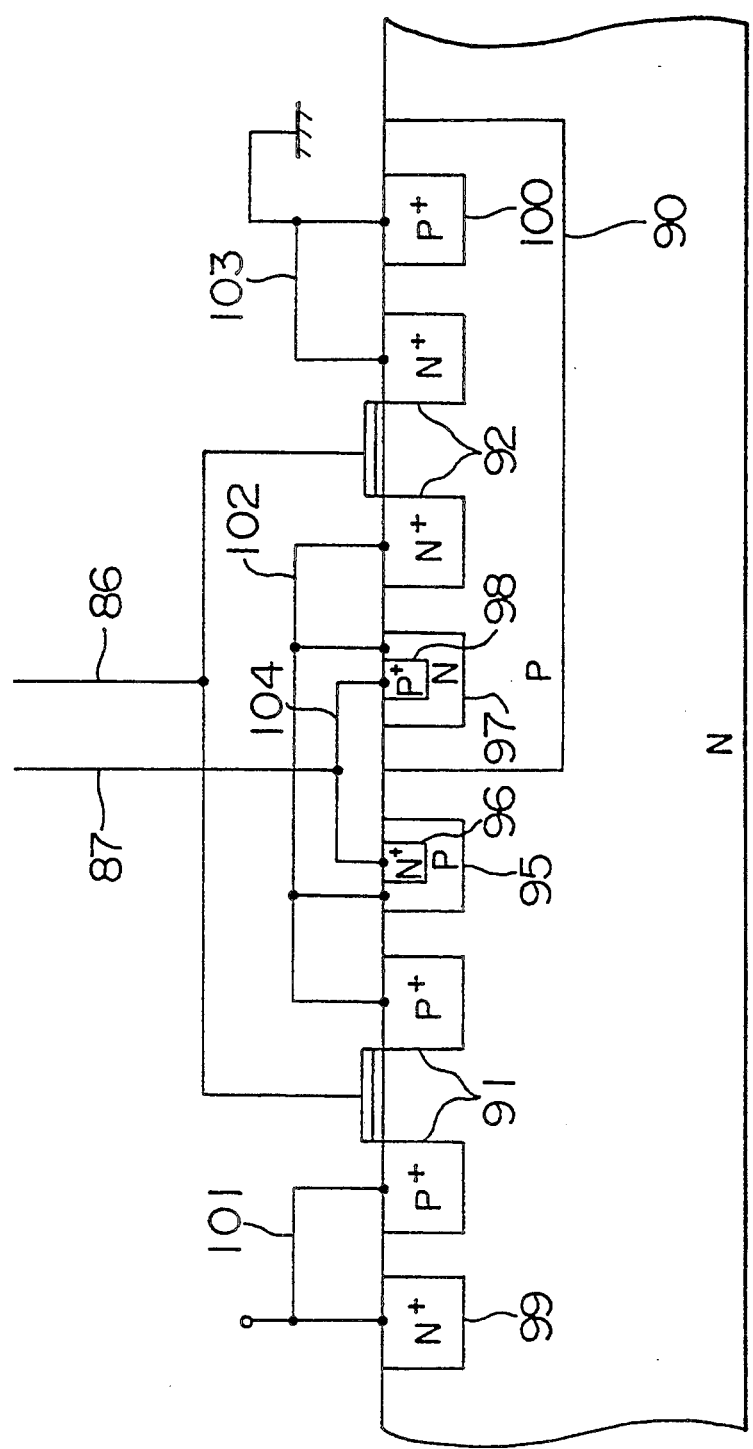
Figure 18:
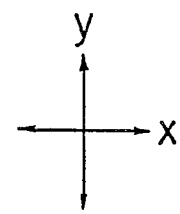
Figure 18:
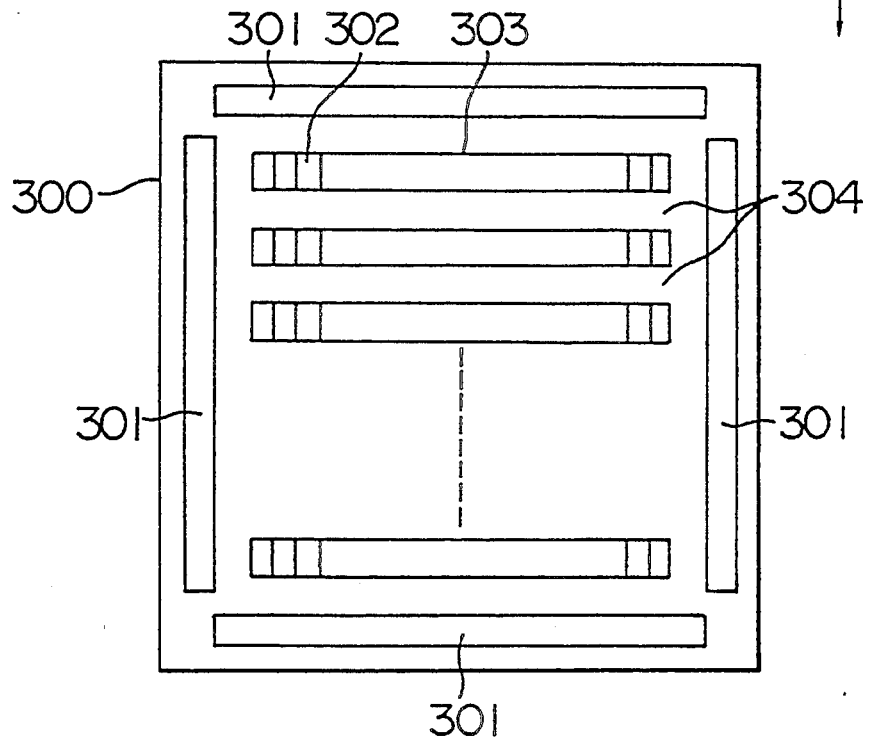
Figure 19:
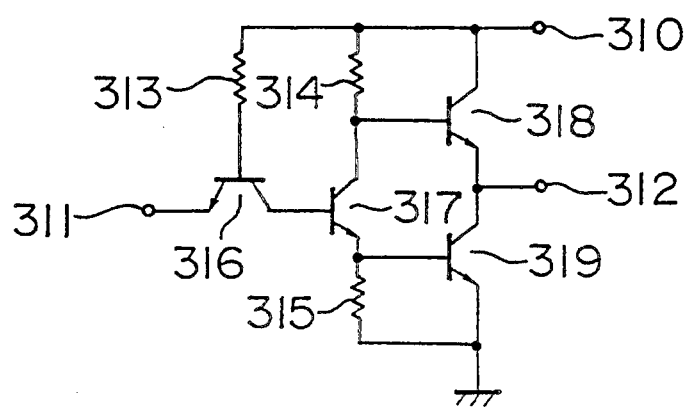
Figure 20:
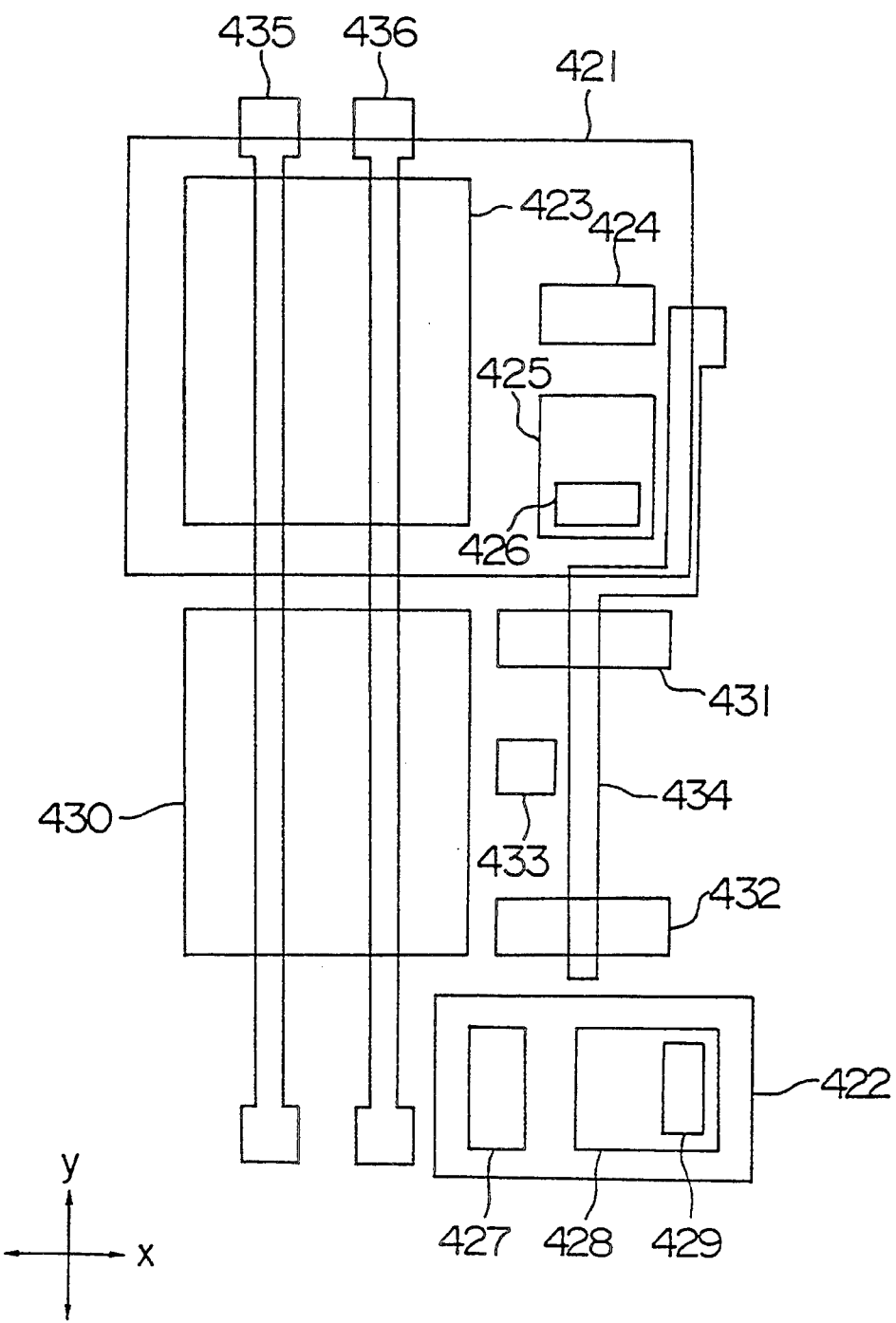
Figure 21:
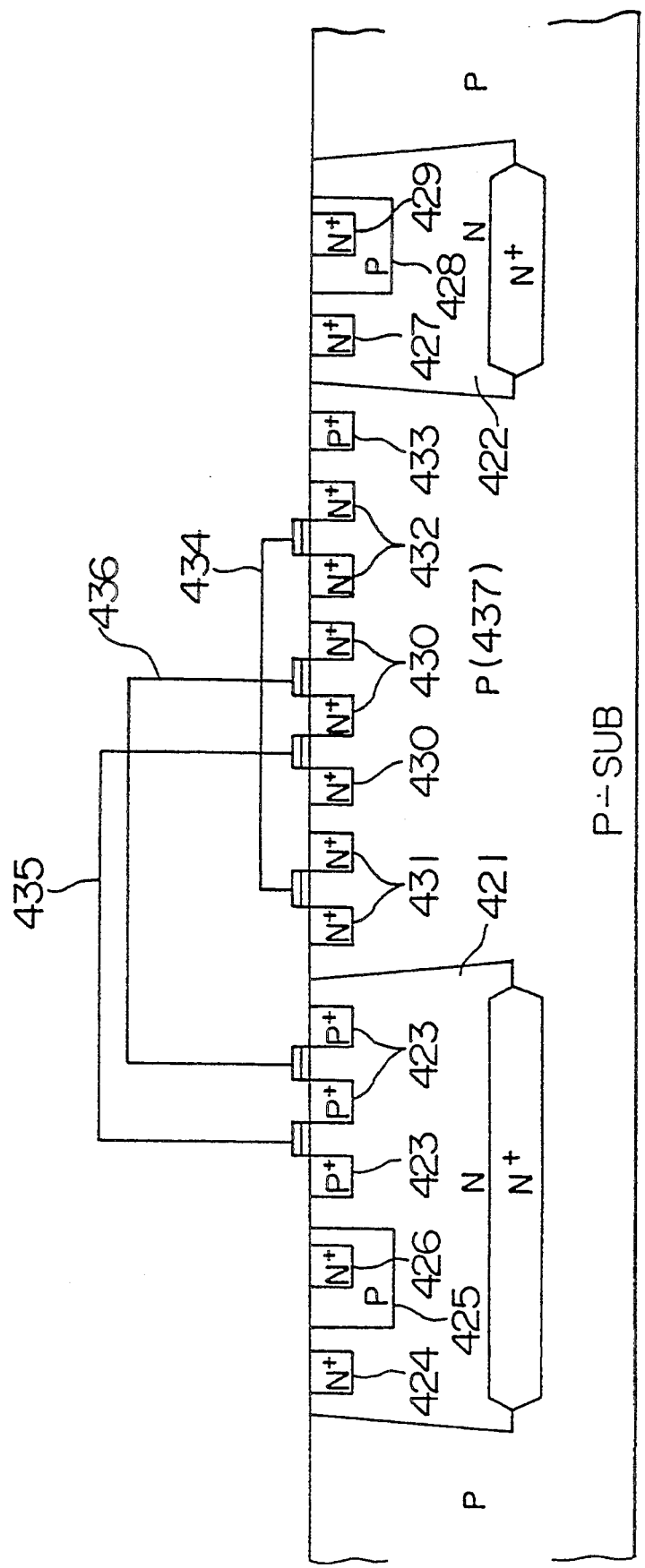
Figure 22:
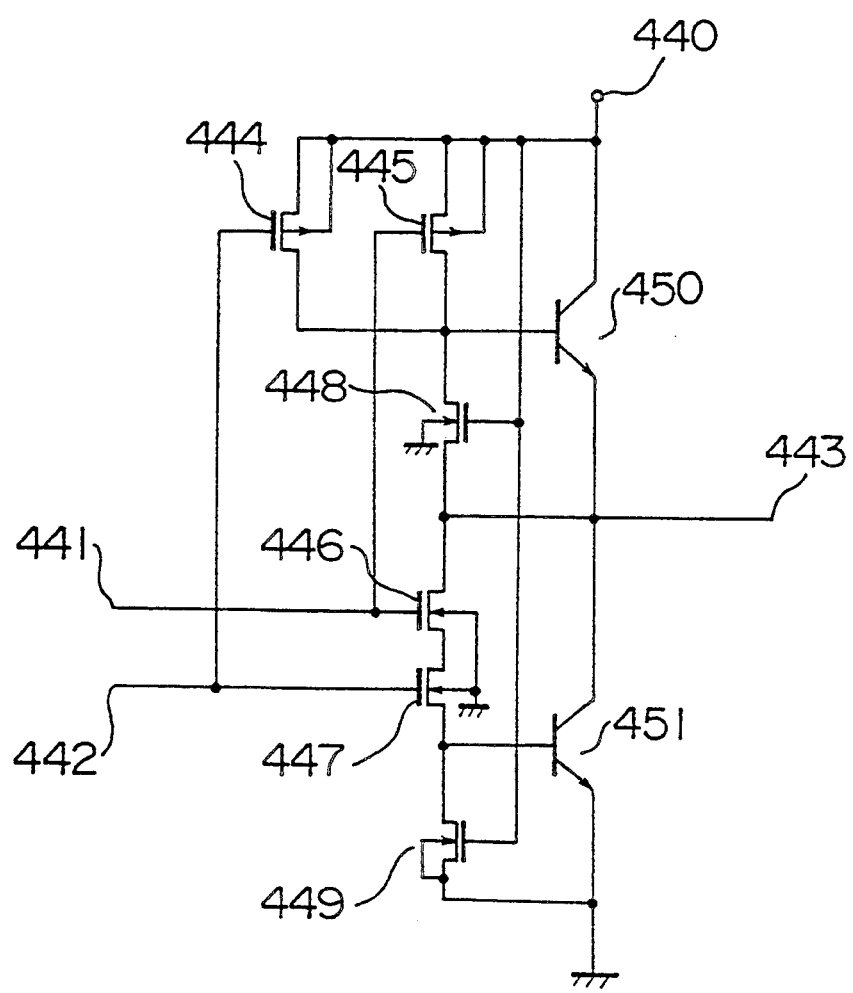
Figure 23:
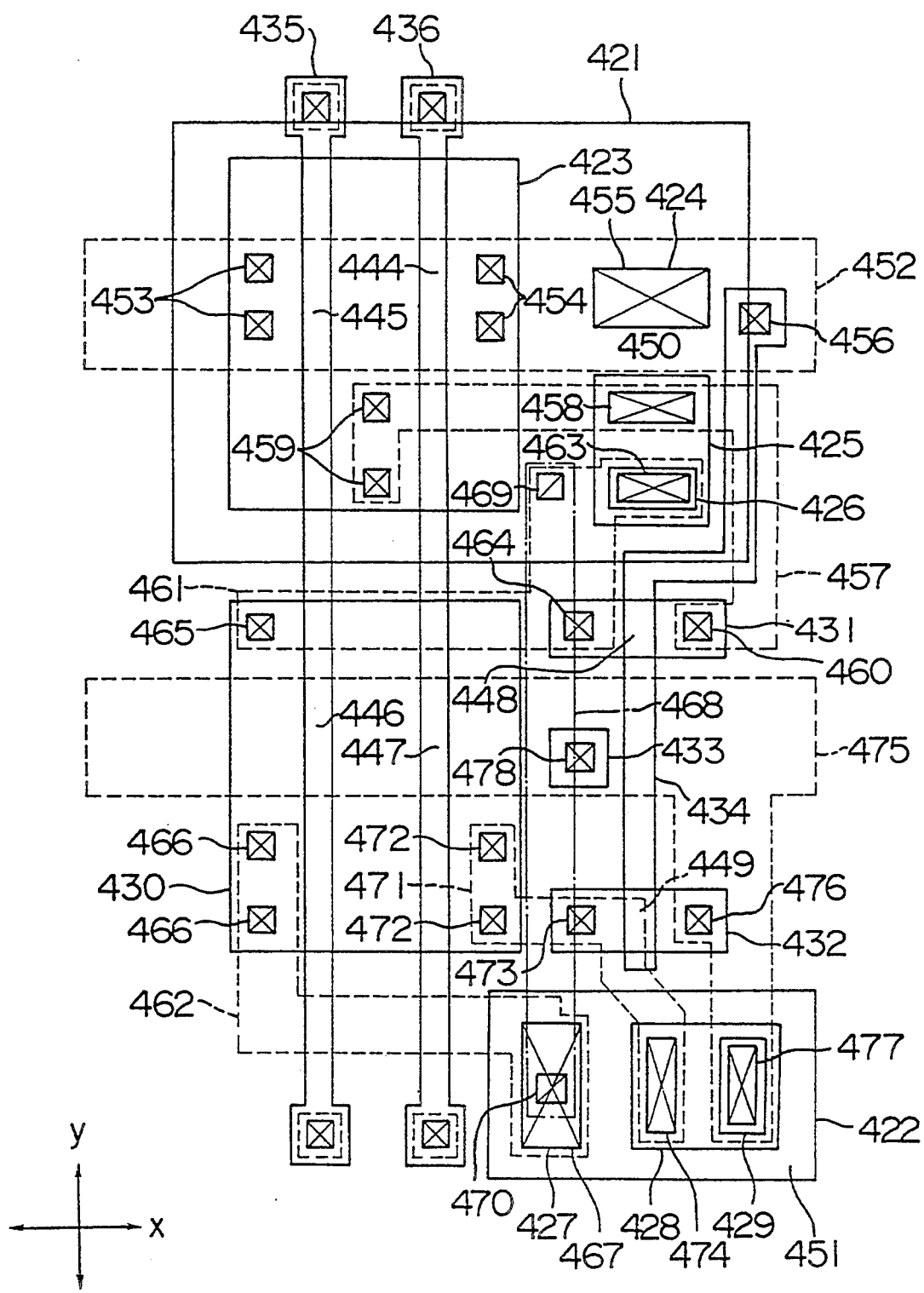
Figure 24:
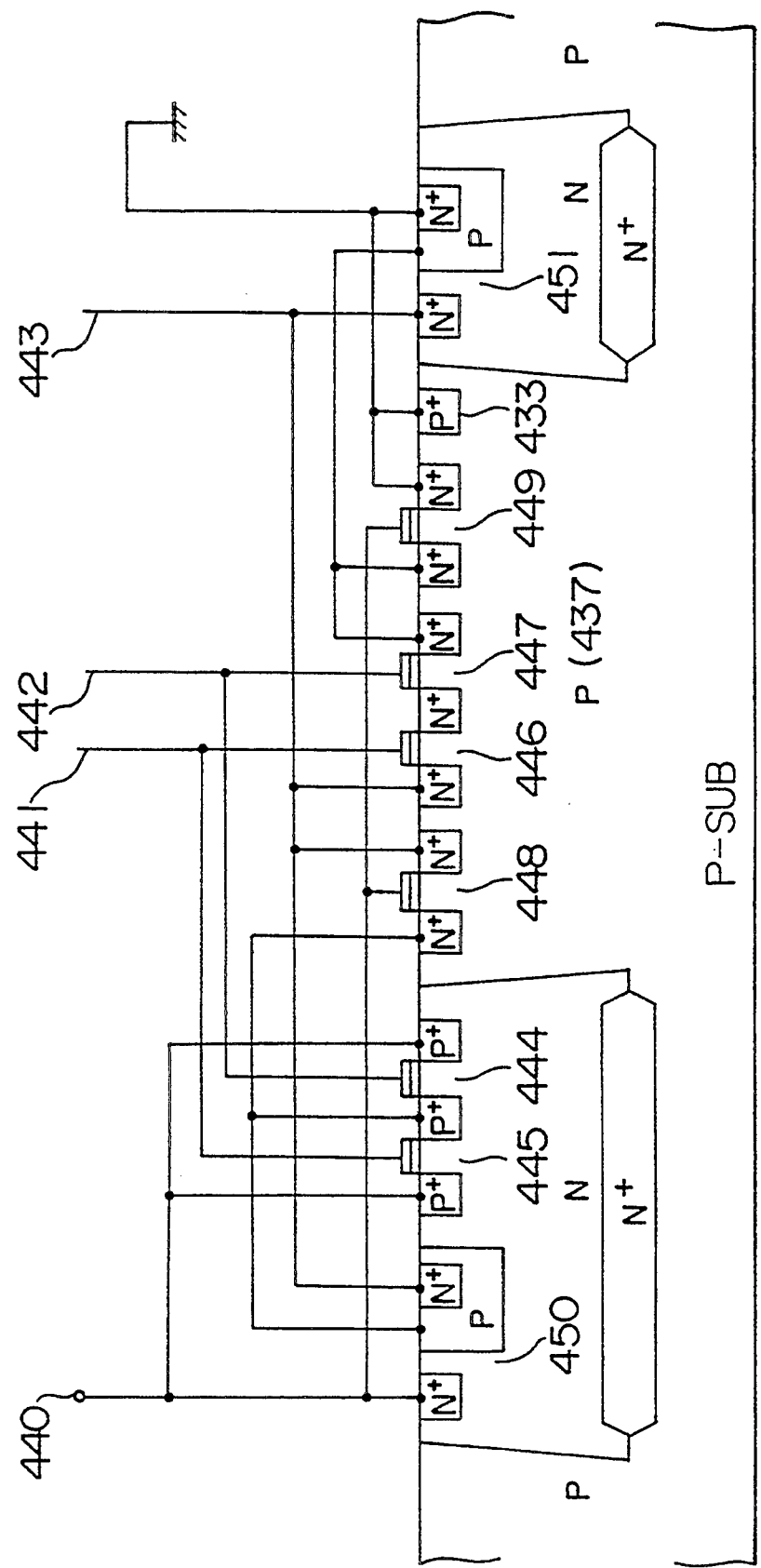
Figure 25:
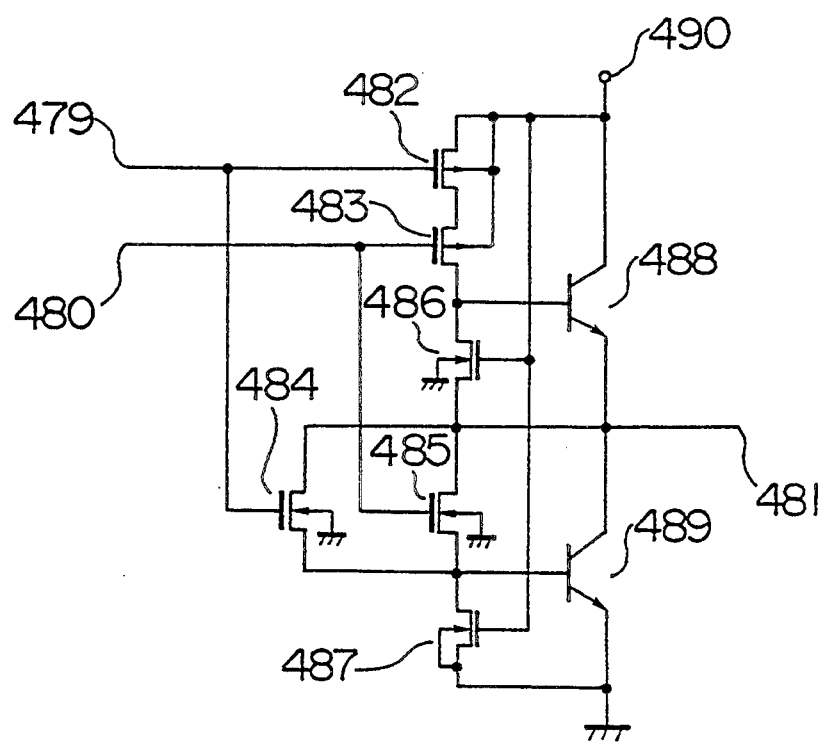
Figure 27:
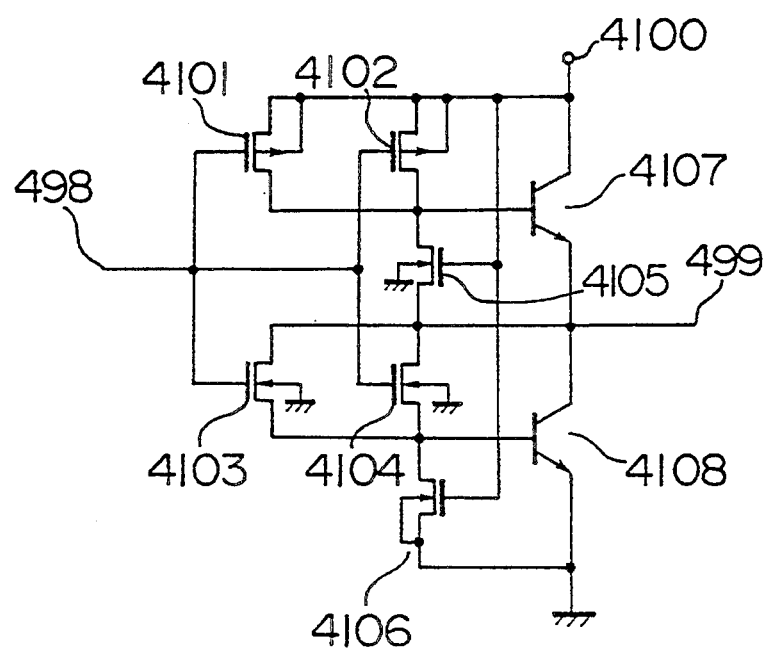
Figure 26:
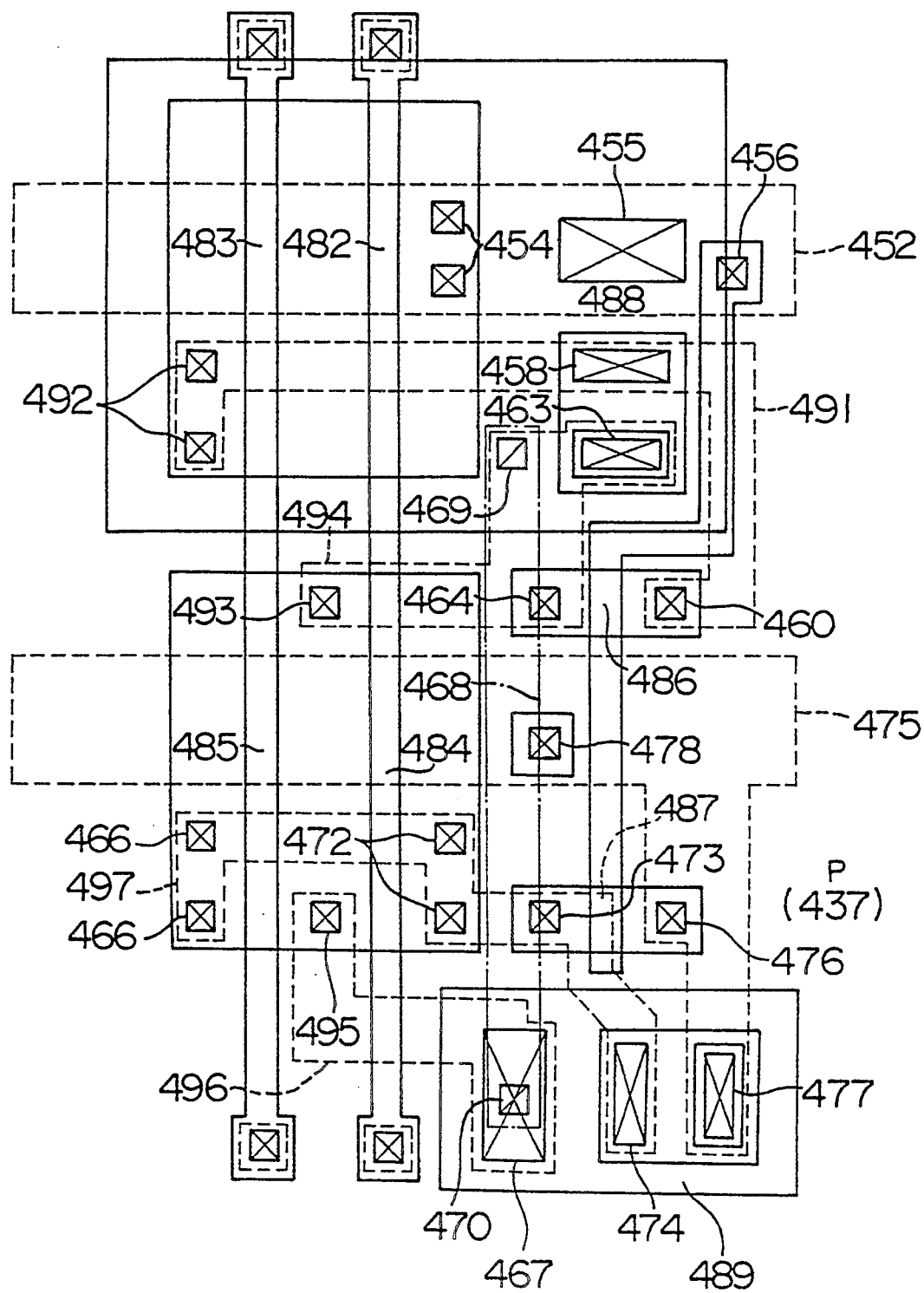
Figure 28:
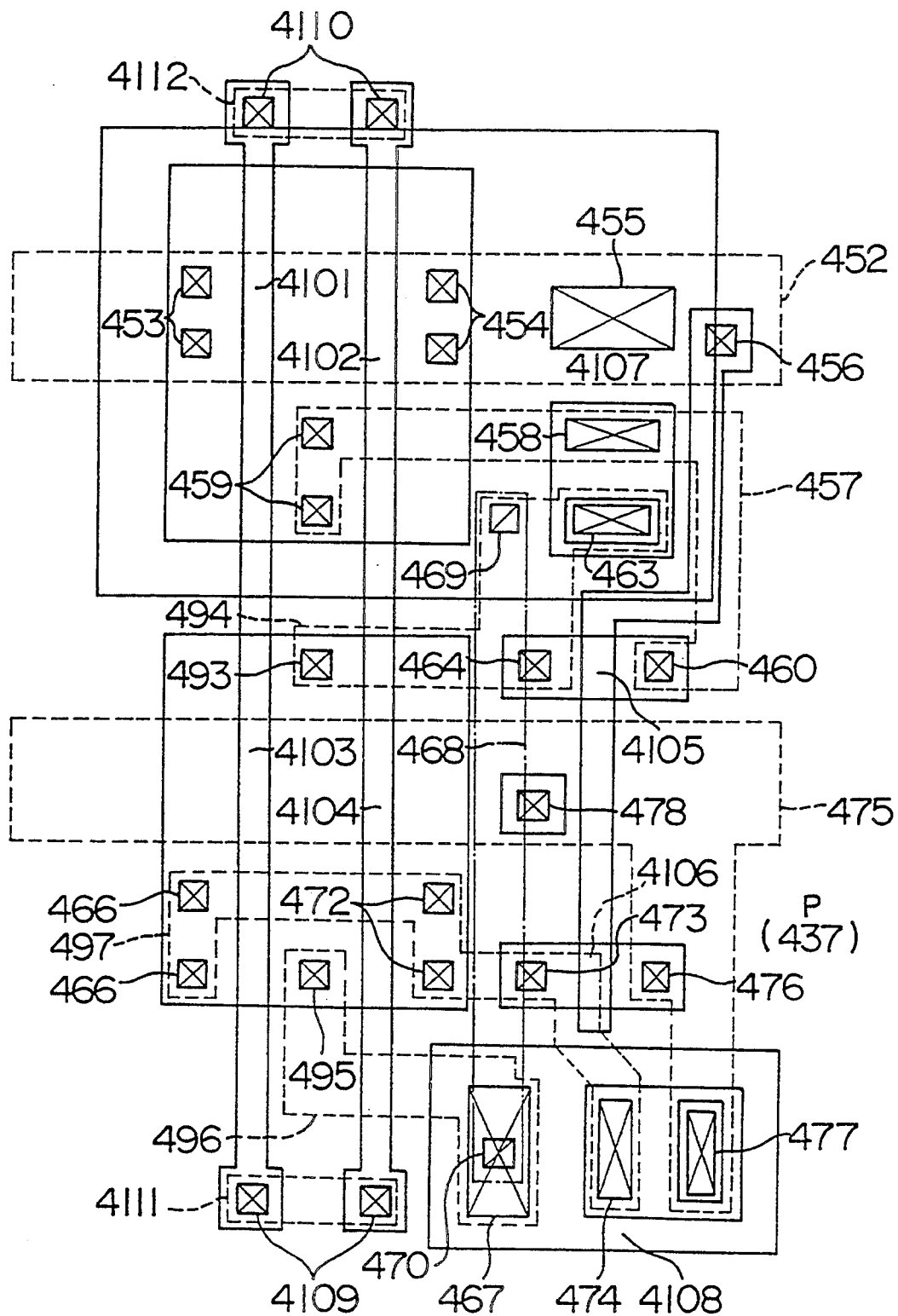
Figure 29:
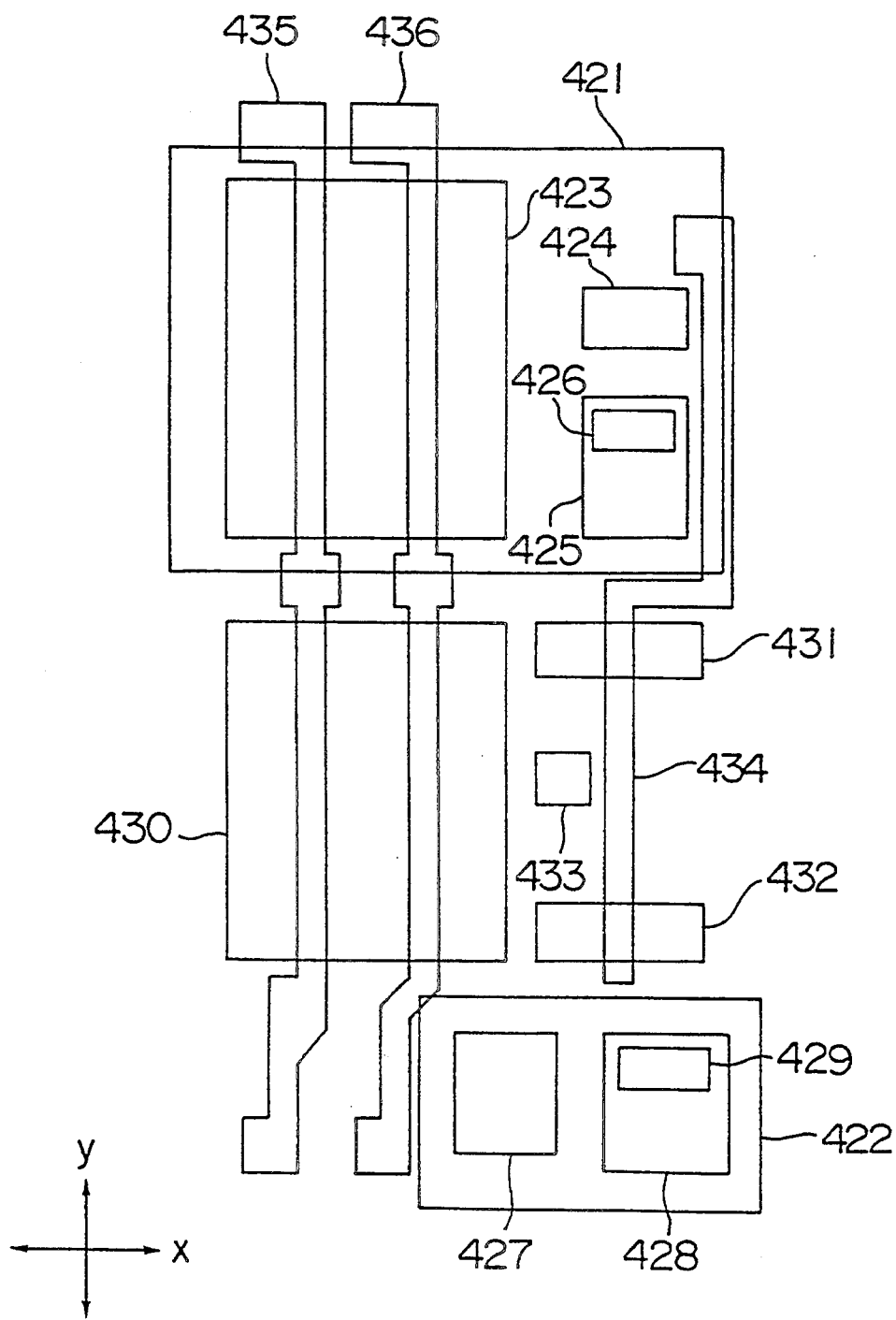
Figure 30:
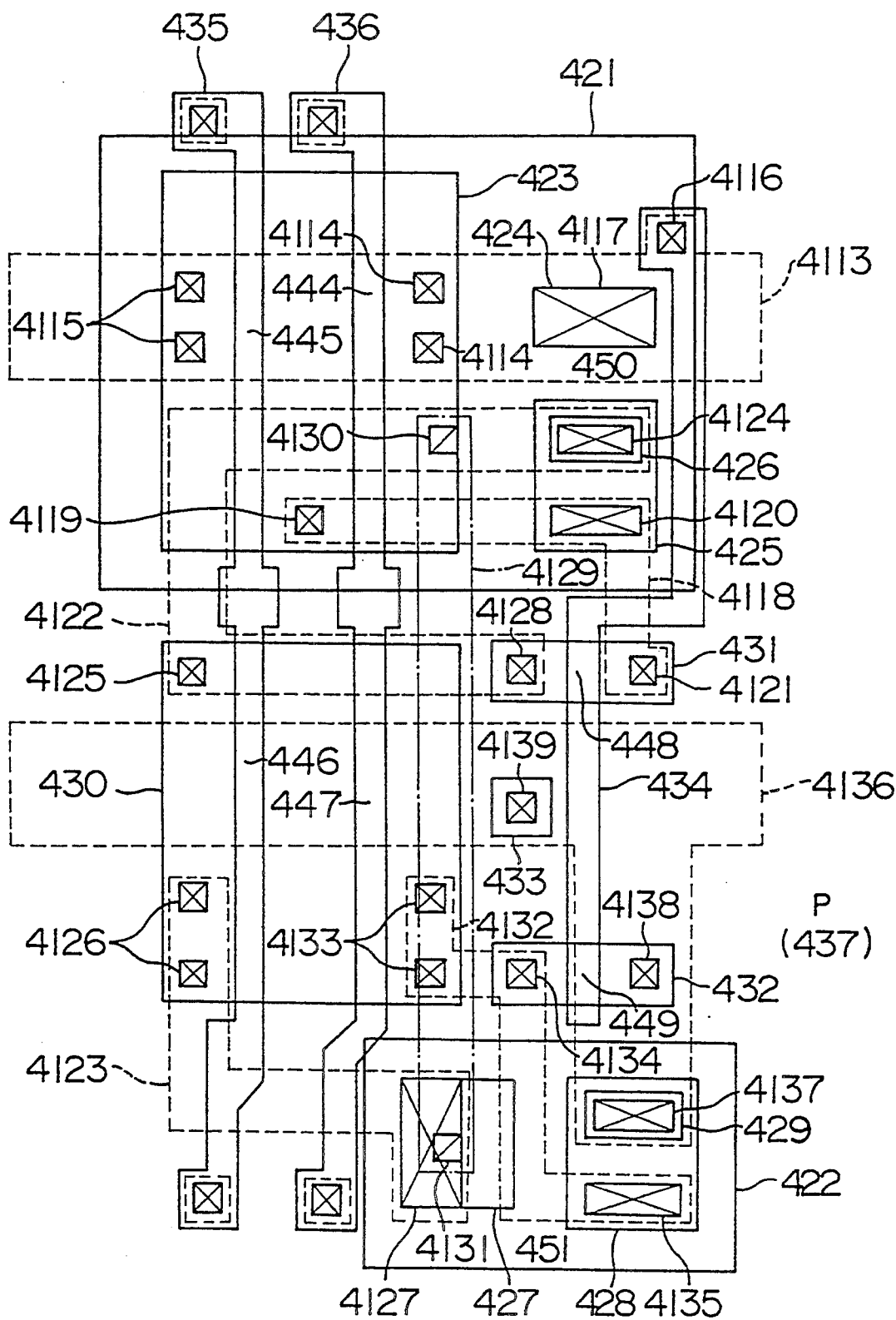
Figure 31:
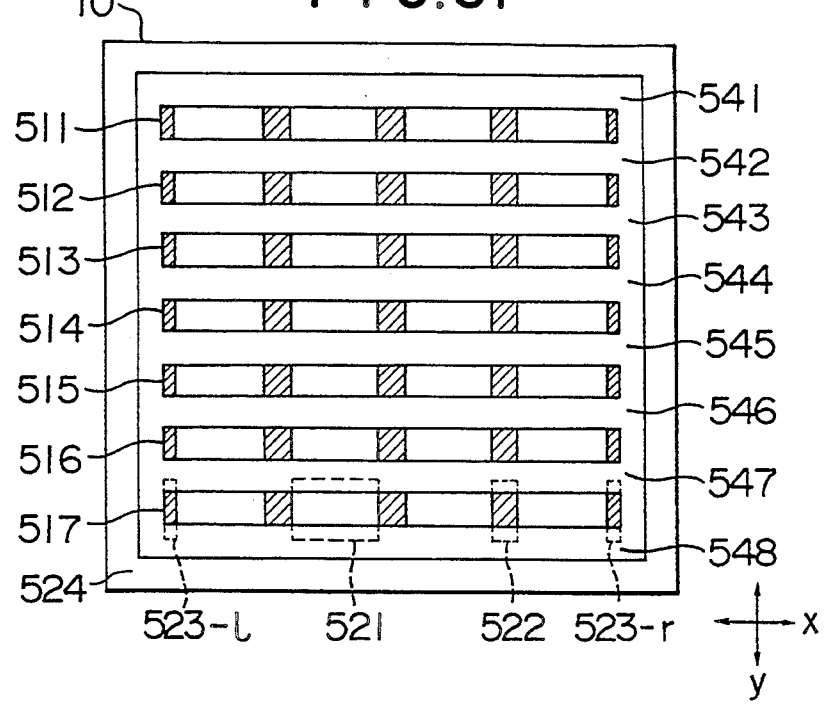
Figure 32A:
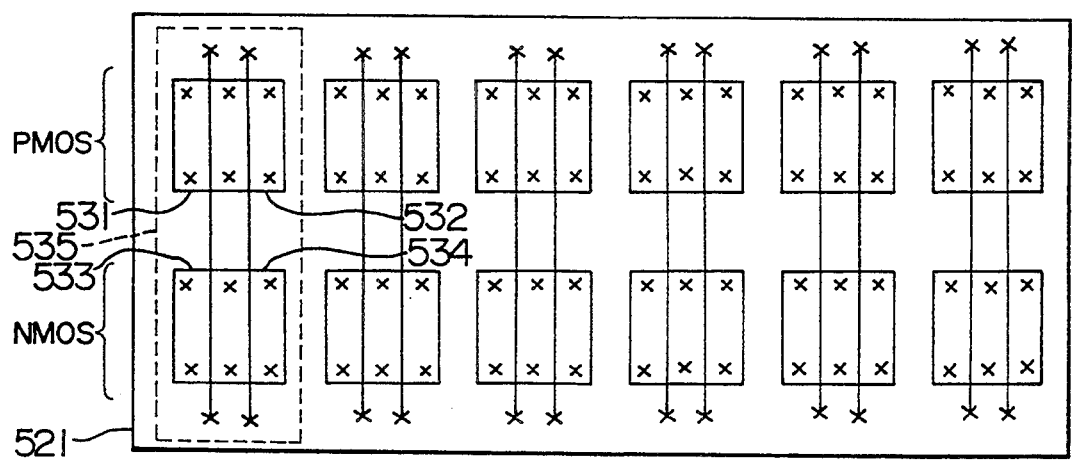
Figure 32B:
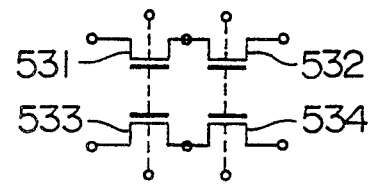
Figure 33A:
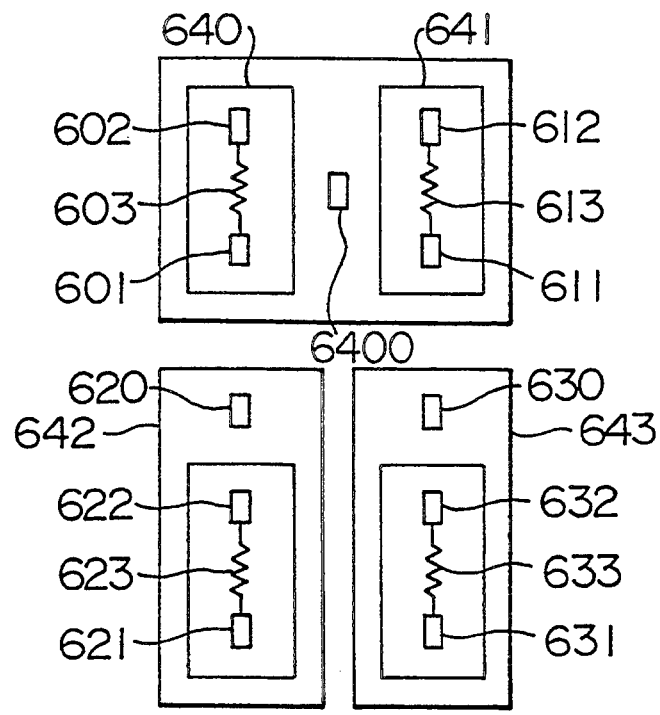
Figure 33B:
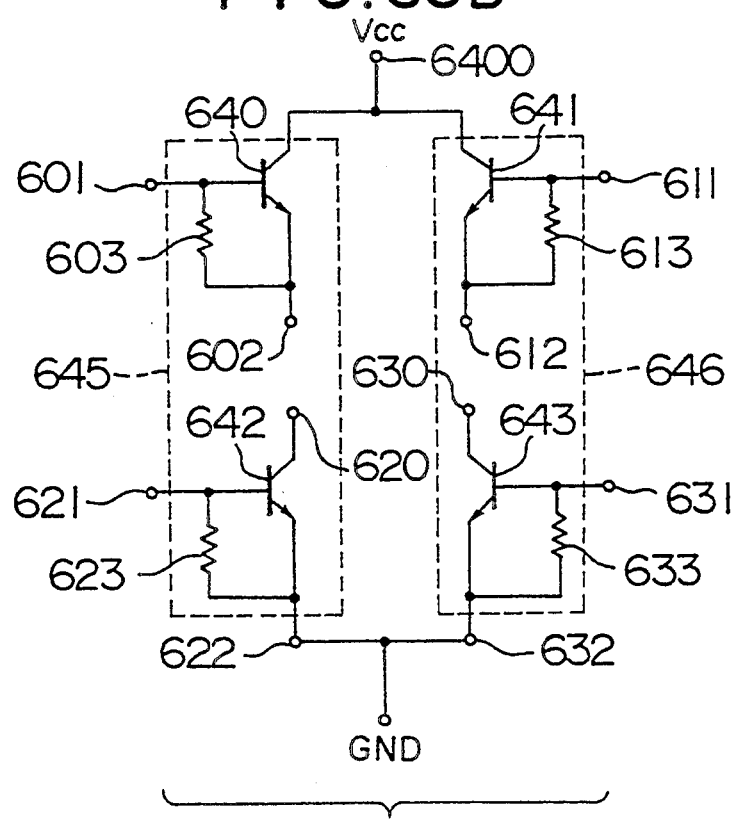
Figure 34A:
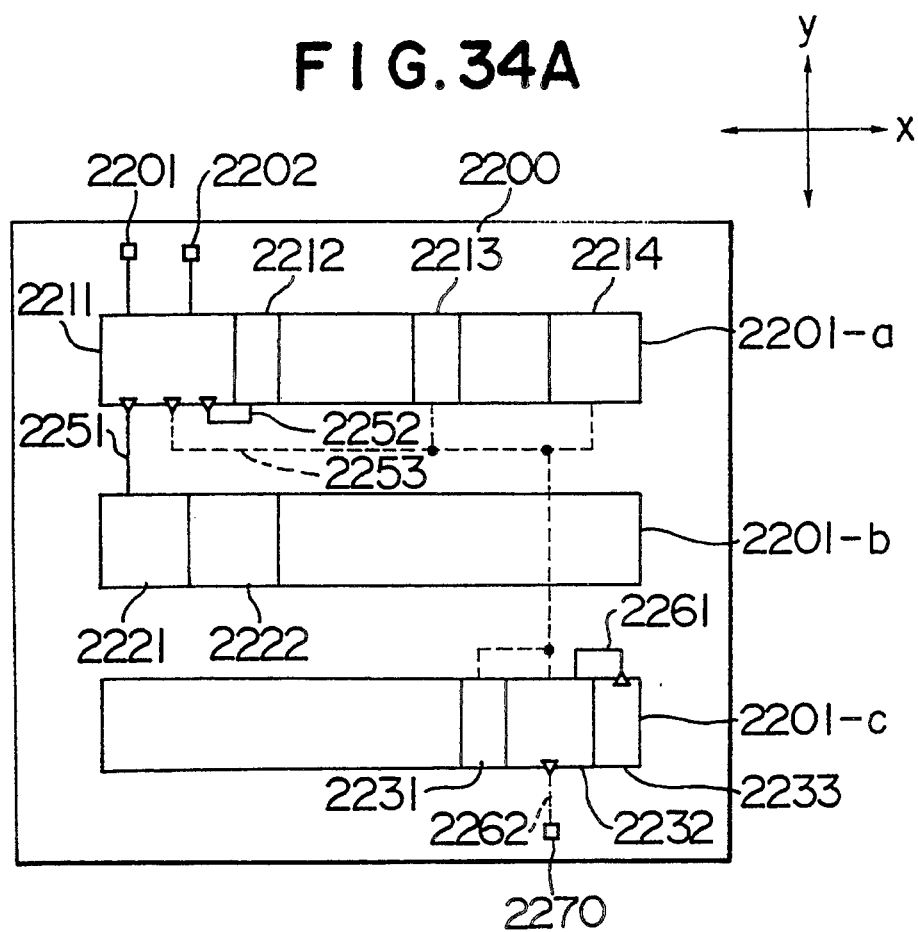
Figure 34B:
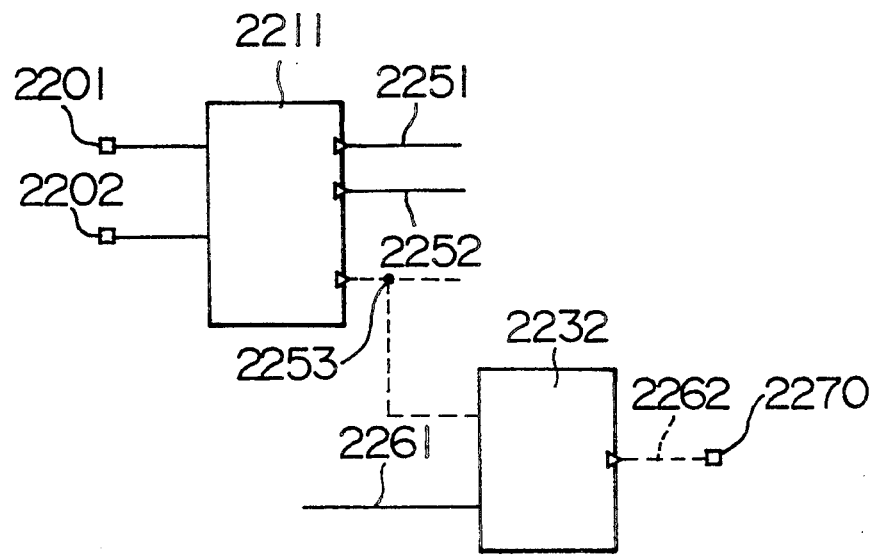
Figure 35:
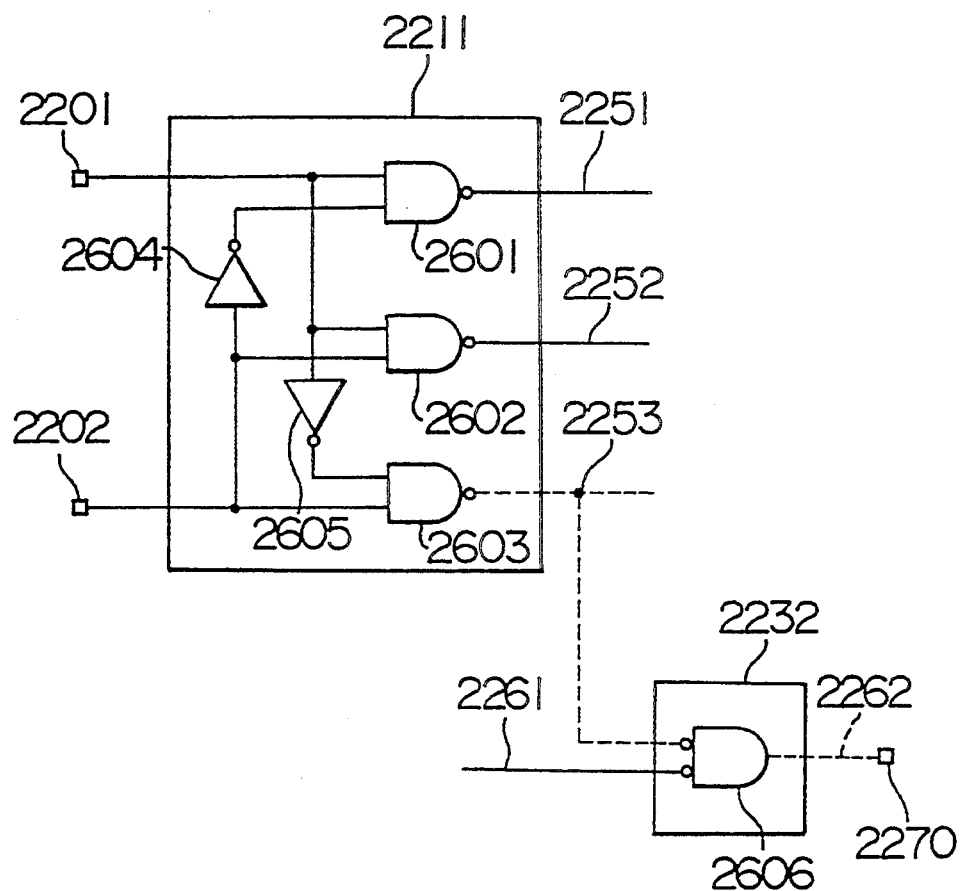
Figure 36:
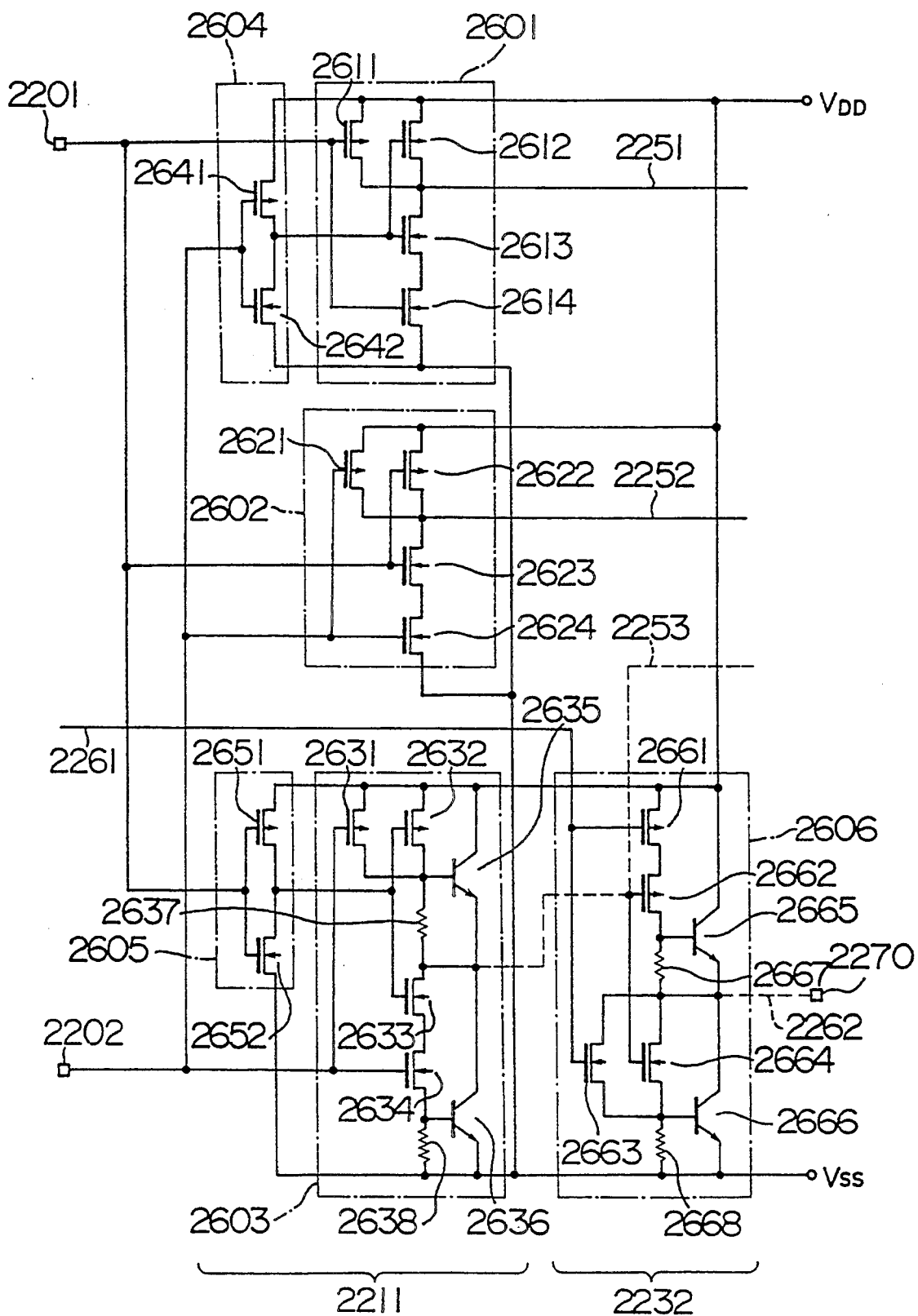
Figure 37:
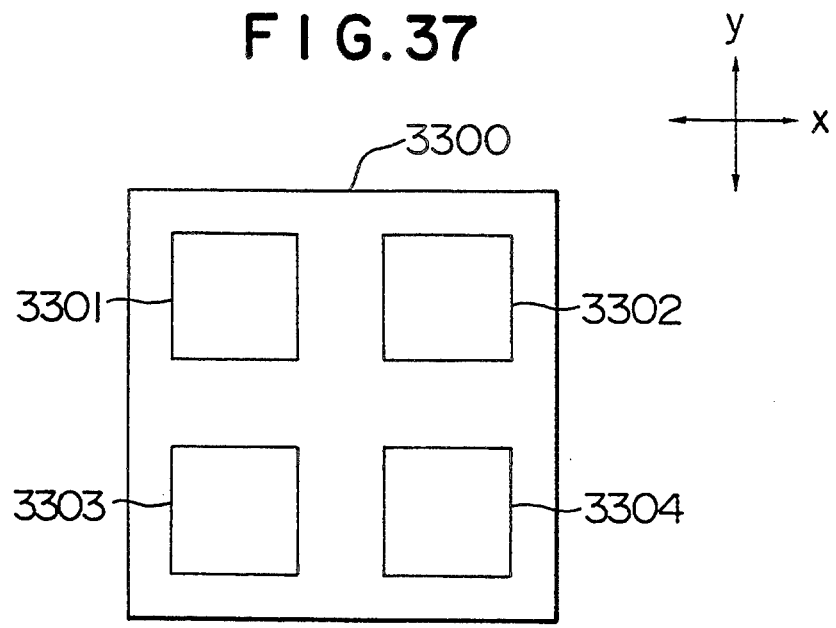
Figure 38:
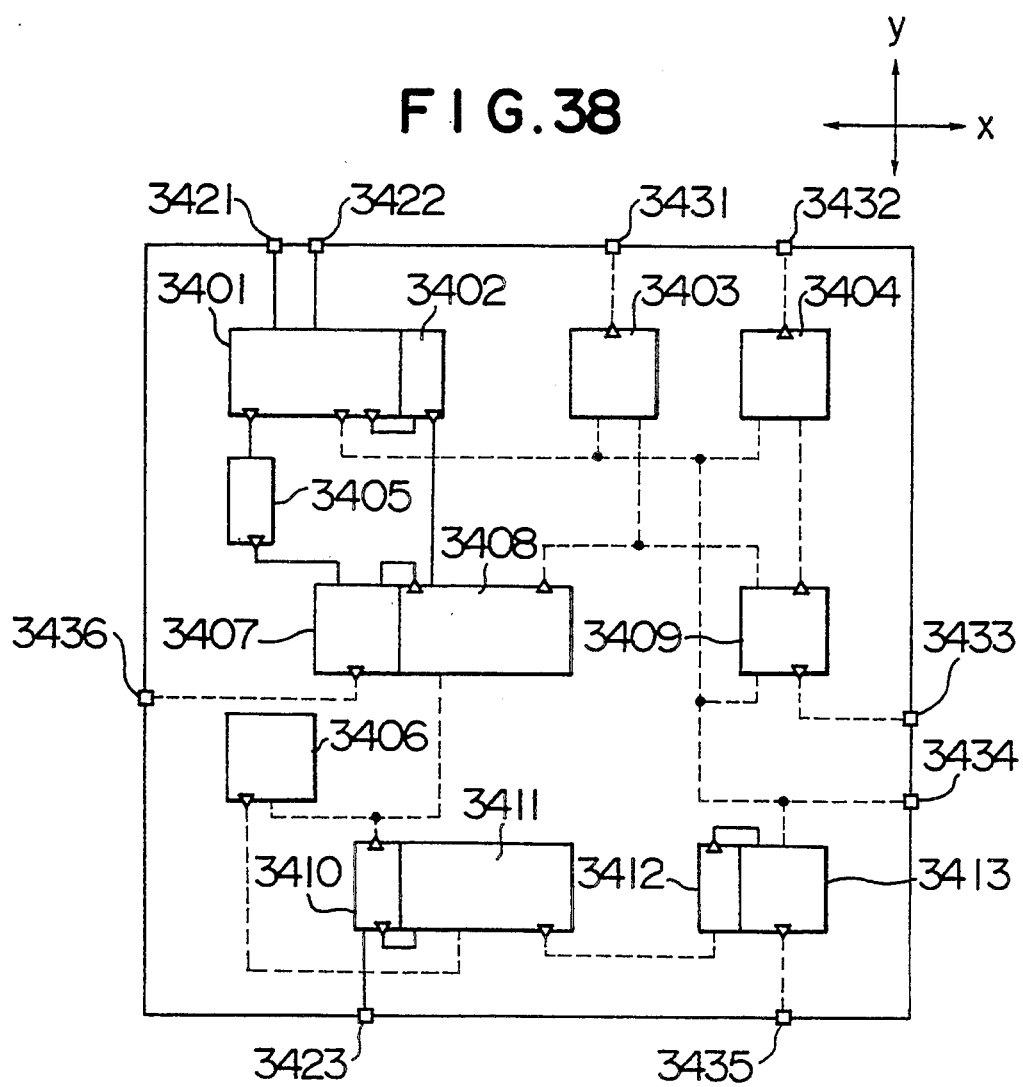

The present invention will be apparent from the following detailed description taken in conjunction with the accompanying drawings, in which:

FIG. 1 shows a prior art gate array LSI chip,

FIG. 2 shows a bipolar-CMOS hybrid two-input NAND circuit used in an embodiment of the present invention, FIG. 3 shows a pattern of the circuit of FIG. 2 constructed by basic cells used in the embodiment of the present invention, FIG. 4 is a sectional view of FIG. 3, FIG. 5 shows a basic cell used in the embodiment of the present invention, FIG. 6 shows a bipolar-CMOS hybrid two-input NAND circuit used in the embodiment of the present invention, FIG. 7 shows a pattern of the circuit of FIG. 6 constructed by basic cells used in the embodiment of the present invention, FIG. 8 shows a basic cell used in the embodiment of the present invention, FIG. 9 shows a bipolar-CMOS hybrid two-input NAND circuit used in the embodiment of the present invention, FIG. 10 shows a pattern of the circuit of FIG. 9 constructed by basic cells used in the embodiment of the present invention, FIG. 11 is a sectional view of FIG. 10, FIG. 12 shows a bipolar-CMOS hybrid two-input NAND circuit used in the embodiment of the present invention, FIG. 13 shows a pattern of the circuit of FIG. 12 constructed by basic cells used in the embodiment of the present invention, FIG. 14 is a sectional view of FIG. 13, FIG. 15 shows a bipolar-CMOS hybrid two-input NAND circuit used in the embodiment of the present invention, FIG. 16 shows a pattern of the circuit of FIG. 15 constructed by basic cells used in the embodiment of the present invention, FIG. 17 is a sectional view of FIG. 16, FIG. 18 shows a master structure of a gate array LSI in accordance with the embodiment of the present invention, FIG. 19 shows an output circuit used in the embodiment of the present invention, FIG. 20 shows a plane pattern of a basic cell used in the embodiment of the present invention, FIG. 21 is a sectional view of FIG. 20, FIG. 22 shows a bipolar-CMOS hybrid two-input NAND circuit, FIG. 23 shows a plane pattern of the circuit of FIG. 22 constructed by the basic cells shown in FIG. 20, FIG. 24 is a sectional view of FIG. 23, FIG. 25 shows a bipolar-CMOS hybrid two-input NOR circuit, FIG. 26 shows a plane pattern of the circuit of FIG. 25 constructed by the basic cells shown in FIG. 20, FIG. 27 shows a bipolar-CMOS hybrid inverter circuit, FIG. 28 shows a plane pattern of the circuit of FIG. 27 constructed by the basic cells shown in FIG. 20, FIG. 29 shows a plane pattern of a basic cell used in the embodiment of the present invention, FIG. 30 shows a plane pattern of the circuit of FIG. 22 constructed by the basic cells shown in FIG. 29, FIG. 31 shows a master structure of a gate array LSI in accordance with another embodiment of the present invention, FIGS. 32A and 32B show structures of the MOS array of FIG. 31, FIGS. 33A and 33B show structures of the bipolar array of FIG. 31, FIGS. 34A and 34B show other embodiment of the present invention, FIG. 35 shows a specific circuit of FIG. 34B, FIG. 36 shows a specific circuit of FIG. 35, FIG. 37 shows a semiconductor integrated circuit device comprising four sub-chips, and FIG. 38 shows other embodiment of the present invention.

The preferred embodiments of the present invention will now be described in detail.

FIG. 18 shows one embodiment of the gate array LSI of the present invention.

Numeral 300 denotes a semiconductor substrate which comprises input/output circuits 301 arranged on a periphery thereof, a plurality of basic cell lines 303 each having a plurality of basic cells 302 constructed as described hereinafter arranged in an x-direction and wiring zones 304 among the basic cell lines. In order to attain a desired electrical circuit for the LSI, one or more adjacent basic cells 302 are connected to form an internal circuit such as a gate circuit or a flip-flop. The internal circuits themselves and the internal circuits and the input/output circuits are interconnected by an computer-aided wiring to form the desired LSI.

In the present embodiment, the input/output circuits are preferably constructed primarily by bipolar transistors such as TTL or ECL in view of high speed and high load drive capability.

FIG. 19 shows a typical TTL output circuit. Numeral 310 denotes a power supply terminal, numeral 311 denotes an input terminal, numeral 312 denotes an output terminal, numerals 313, 314 and 315 denote resistors, and numerals 316–319 denote NPN bipolar transistors. This circuit is a well-known TTL inverter circuit and hence the operation thereof is not explained here. A known ECL circuit may be used.

A similar circuit to that of FIG. 19 may be used as the input circuit. The input/output circuit may be a bipolar-CMOS hybrid circuit which will be described later.

FIG. 2 shows a totem pole output two-input NAND circuit which is a basic cell used to construct an internal circuit used in an embodiment of the present invention.

In FIG. 2, numeral 20 denotes a first NPN transistor having a collector thereof connected to a power supply terminal 203 and an emitter thereof connected to an output terminal 202, numeral 21 denotes a second NPN transistor having a collector thereof connected to the output terminal 202 and an emitter thereof connected to a fixed potential terminal which is a ground potential GND, numeral 201 denotes input terminals, numerals 22 and 23 denote PMOS's having gates thereof connected to the respective input terminals 201 and sources and drains thereof connected in parallel to the collector and the base of the first NPN 20, numerals 26 and 27 denote NMOS's having gates thereof connected to the respective input terminals 201 and sources and drains thereof connected in series across the collector and the base of the second NPN 21, and numerals 210 and 211 denote resistors connected between the bases and the collectors of the first and second NPN's 20 and 21, respectively.

Table 1 shows a logical operation of the present embodiment.

TABLE 1

| INPUTS 201 | PMOS's 22, 23 | NMOS's 26, 27 | NPN 20 | NPN 21 | OUTPUT 202 |
|---|---|---|---|---|---|
| Either one is "0". | Either one is ON. | Either one is OFF. | ON | OFF | "1" |
| Both are "0". | Both are ON. | Both are OFF. | ON | OFF | "1" |
| Both are "1". | Both are OFF. | Both are ON. | OFF | ON | "0" |

When either one of the inputs 20 1 is "0", either one of the PMOS's 22 and 23 are ON and either one of the NMOS's 26 and 27 are OFF. Accordingly, the base potential of the first NPN 20 rises and the first NPN 20 is turned on and the base-emitter circuit of the second NPN 21 is shorted by the resistor 211. Thus, the emitter current of the first NPN 20 charges up the load and the output 202 assumes the "1" level.

When both inputs 201 are "0", both PMOS's 22 and 23 are ON and both NMOS's 26 and 27 are OFF. Accordingly, the operation is same as that described above and the output 202 assumes the "1" level.

When both inputs 201 are "1", both PMOS's 22 and 23 are OFF and both NMOS's 26 and 27 are ON. Accordingly, the base-emitter circuit of the first NPN 20 is shorted by the resistor 210 and the first NPN 20 is turned off, and the base-collector circuit of the second NPN 21 is shorted by the NMOS's 26 and 27 and the current from the output 202 is supplied to the base of the second NPN 21 so that the second NPN 21 is turned on and the output 20 2 assumes the "0" level. When the NPN transistors are ON, the resistors 210 and 211 shunt the base currents, and when the NPN transistors are turned off, the resistors 210 and 211 serve to discharge the charges stored in the bases.

In accordance with the present embodiment, the two-input NAND circuit is constructed by a minimum configuration of the CMOS's and the bipolar transistors. The present embodiment can attain a high speed operation because it uses the NPN bipolar transistors which have an excellent high frequency characteristic.

The present embodiment also attains a high input impedance and low output impedance circuit and attains a low power consumption characteristic because a DC patch from the power supply 203 to the ground is not formed.

FIG. 3 shows a layout pattern for constructing the bipolar-CMOS hybrid circuit, and FIG. 4 shows a sectional view of FIG. 3. FIG. 4 shows an inverter circuit but the like elements are designated by the like numerals to those of FIG. 3.

In FIG. 3, a pattern of a buried layer 227 of FIG. 4 is omitted for the sake of simplicity. In an isolation region 212, the PMOS's 22 and 23, the NPN 20, the resistors 210 and 211 and the NMOS's 26 and 27 are formed, and in an isolation region 213, the NPN 21 is formed. The numerals for the MOS transistors corresponding to those of FIG. 2 are shown on gate electrodes 220 and 221 of FIG. 3. A P+region 219 and the gate electrodes 220 and 221 form the PMOS's 22 and 23, and an N+region 223 in a P well 214 and the gate electrodes 221 and 220 form the NMOS's 26 and 27. The NPN 20 has a P region 217 as the base, an N+region 218 in the P region 217 as the emitter and an N+region 215 as the collector. The resistors 210 and 211 are formed by P regions 216 and 222, respectively. The NPN 21 has a P region 225 in the isolation region 213 as the base, an N+region 226 in a P region 225 as the emitter and an N+region 224 as the collector.

The interconnection of the elements is now explained. The collector 215 of the NPN 20 and the sources of the PMOS's 22 and 23 are connected to the power supply by an AL wire 42. A symbol ⊠ indicates a contact between the AL wire and the element. The drains of the PMOS's 22 and 23, the base of the NPN 20 and one end of the resistor 210 are interconnected by an AL wire 228. The other end of resistor 210 and the emitter 218 of the NPN 20 are interconnected by AL wire 229. The emitter 226 of the NPN 21, one end of the resistor 211 and the P well 214 are connected to the ground potential by the AL wire 43. The other end of the resistor 211, the source of the NMOS 27 and the base of the NPN 21 are interconnected by an AL wire 230. The drain of the NMOS 26 and the collector 224 of the NPN 21 are interconnected by an AL wire 231. While not shown, the emitter 218 of the NPN 20 and the collector 224 of the NPN 21 are interconnected by a second level AL wire.

FIG. 5 shows a pattern in which the AL wires and the contacts of the layout pattern shown in FIG. 3 have been removed. By applying the AL wires and the contacts of FIG. 3 to the pattern of FIG. 5, the two-input NAND circuit is constructed, and by applying other AL wires and contacts, an inverter or a two-input NOR circuit is constructed. When a flip-flop is to be constructed, as many patterns of FIG. 5 as necessary may be laterally arranged. Accordingly, by arranging the basic cells of FIG. 5 in a manner shown in FIG. 18, the basic cell line of the gate array is constructed. In accordance with the present embodiment, the gate array LSI having the basic cells for constructing the bipolar-CMOS hybrid logic circuit is attained and the high speed and low power consumption gate LSI is provided.

FIG. 6 shows another embodiment of the totem pole output two-input NAND circuit. In FIG. 6, the resistor 210 in the embodiment of FIG. 2 has been substituted by an NMOS 240 and a PMOS 242 and the resistor 211 has been substituted by an NMOS 241. A gate of the NMOS 240 is connected to the power supply terminal 203 and a drain and a source are connected to the base and the emitter, respectively, of the NPN 20. A gate of the NMOS 241 is connected to the power supply terminal 203, a drain and a source are connected to the base and the emitter, respectively, of the NPN 21, a gate of the PMOS 242 is connected to the ground potential, and a drain and a source are connected to the emitter and the base, respectively, of the NPN 20. The like elements to those of FIG. 2 are designated by the like numerals. The operation is essentially same as that of FIG. 2. The NMOS 241 always operates in a non-saturation region and functions for the resistor 211. When one of the inputs 201 is "0", the PMOS 24 2 functions to raise the output 202 to the power supply voltage, and when the output 202 is "0", the NMOS 240 functions to short the base-emitter circuit of the NPN 20 to turn off the NPN 20 so that a current flowing from the power supply terminal 20 3 to the ground through the NPN's 20 and 21 is blocked and the power consumption is reduced. In the present embodiment, since the MOS transistors having a small channel width Are used in place of the resistors, an integration density is further improved.

FIG. 7 shows a layout pattern for constructing the bipolar-CMOS hybrid circuit. In FIG. 7, a pattern of a buried layer is omitted for the sake of simplification. In an isolation region 243, the PMOS's 22, 23 and 24 2, the NPN 20 and the NMOS's 26, 27, 240 and 241 are formed, and in an isolation region 244, the NPN 21 is formed. Numerals for the MOS transistors corresponding to those of FIG. 6 are shown on the gate electrodes 253, 254 255 and 256 The P+region 249 and the gate electrodes 253, 254 and 255 form the PMOS's 242, 23 and 22, and the N+region 250 in the P well 245 and the gate electrodes 254 and 255 form the NMOS's 26 and 27. The N+regions 251 and 252 in the P well 245 and the gate electrode 256 form the NMOS's 240 and 241. The NPN 20 includes the P region 247 as the base, the N+region 248 in the P region 247 as the emitter and the N+region 246 as the collector. The NPN 21 includes the P region 258 in the isolation region 244 as the base, the N+region 259 in the P region 258 as the emitter and the N+region 257 as the collector.

The interconnection of the elements is now explained. The collector 246 of the NPN 20, the sources of the PMOS's 22 and 23 and the gates 256 of the NMOS's 240 and 241 are connected to the power supply by the AL wire 42. A symbol ⊠ indicates a contact between the AL wire and the element. The drains of the PMOS's 22 and 23, the base 247 of the NPN 20 and the source of the PMOS 242 are interconnected by the AL wire 260. The emitter 248 of the NPN 20 and the drain of the PMOS 242 are interconnected by the AL wire 261. The drain of the PMOS 242, the drain of the NMOS 26 and the source of the NMOS 240 are interconnected by the AL wire 262. The drain of the NMOS 26 and the collector 257 of the NPN 21 are interconnected by the AL wire 263. The source of the NMOS 27, the drain of the NMOS 241 and the base 258 of the NPN 21 are interconnected by the AL wire 264. The emitter 259 of the NPN 21, the source of the NMOS 241, the gate 253 of the PMOS 242 and the P well 245 are connected to the ground potential by the AL wire 43.

FIG. 8 shows a pattern in which the AL wires and the contacts of the layout pattern shown in FIG. 7 have been removed. By applying the AL wires and the contacts of FIG. 7 to the pattern of FIG. 8, the two-input NAND circuit is constructed, and by applying other AL wires and contacts, an inverter or a two-input NOR circuit is constructed. When a flip-flop is to be constructed, as many patterns of FIG. 8 as necessary may be laterally arranged. Accordingly, by arranging the basic cells of FIG. 8 in a manner shown in FIG. 18, the basic cell line of the gate array is constructed. In the present embodiment, since the MOS transistors having a small channel width are used in place of the resistors, the gate array LSI of a higher integration density is obtained.

In the embodiment of FIG. 6, the PMOS 24 2 is provided between the base and the emitter of the NPN 20. However, the PMOS 242 may be omitted without affecting the actual operation. Thus, the gate array LSI of higher integration density can be obtained.

FIG. 9 shows other embodiment of the totem pole output two-input NAND circuit. The present NAND circuit comprises NPN's 20 and 21, PMOS's 22 and 23, depletion type NMOS transistors (DNMOS's) 24 and 25, NMOS's 26 and 27 and depletion type PMOS transistors (DPMOS's ) 28 and 29. The operation is described below. When either one of the inputs 201 is "0", either one of the PMOS's 22 and 23 is ON, either one of the NMOS's 26 and 27 is OFF and the ON-resistance of either one of the DPMOS's 28 and 29 decreases. As a result, the base potential of the NPN 20 rises and the NPN 20 is turned on, and the base-emitter circuit of the NPN 21 is shorted by the DMPOS 28 or 29 so that the NPN 21 is turned off. Thus, the emitter current of the NPN 20 charges up the load and the output 202 assumes the "1" level. When both inputs 201 are "0", both PMOS's 22 and 23 are ON and both NMOS's 26 and 27 are OFF and the ON-resistances of the DPMOS's 28 and 29 decrease. Accordingly, the operation is same as that described above and the output 202 assumes the "1" level. When both inputs 201 are "1", both PMOS's 22 and 23 are OFF and both NMOS's 26 and 27 are ON and the ON-resistances of the DNMOS's 24 and 25 decrease while the ON-resistances of the DPMOS's 28 and 29 increase. As a result, the base-emitter circuit of the NPN 20 is shorted by the DNMOS's 24 and 25 and the NPN 20 is turned off, and the base-collector circuit of the NPN 21 is shorted by the NMOS's 26 and 27 and the current from the output 202 is supplied to the base of the NPN 21. As a result, the NPN 21 is turned on and the output 20 2 assumes the "0" level.

In the present embodiment, when the NPN is turned off, the ON-resistance of the MOS between the base and the emitter of the NPN is reduced so that the stored charge is rapidly discharged, and when the NPN is turned on, the ON-resistance of the MOS between the base and the emitter increases so that the base current is not shunted and the NPN is rapidly turned on. Accordingly, a higher operation speed is attained.

FIG. 10 shows a layout pattern for constructing the bipolar-CMOS hybrid circuit and FIG. 11 shows a sectional view thereof. FIG. 11 shows an inverter circuit but the like elements are designated by the like numerals to those of FIG. 10. In FIG. 10, a pattern of a buried layer 50 of FIG. 11 is omitted for the sake of simplification. In the isolation region 30, the PMOS's 22 and 23, the DNMOS 24 and 25 and the NPN 20 are constructed, and in the isolation region 44, the NMOS's 26 and 27, the DMOS's 28 and 29 and the NPN 21 are constructed. The numerals for the MOS transistors corresponding to those of FIG. 9 are shown on the gate electrodes 37 and 38 of FIG. 10. The P+region 34 and the gate electrodes 38 and 37 form the PMOS's 22 and 23 the N+region 35 and the gate electrodes 38 and 37 form the NMOS's 26 and 27, the N+region 33 and the gate electrodes 37 and 38 form the DNMOS's 24 and 25, and the P+region 36 and the gate electrodes 37 and 38 form the DPMOS's 28 and 29. The NPN 20 includes the N+region 39 in the isolation region 30 as the collector, the P well 31 as the base and the source of the DNMOS 25 (at the contact hole 41 in FIG, 10) as the emitter. The P well 31 contains the DNMOS's 24 and 25 and also contains portions of the drain regions of the PMOS's 22 and 23 so that the base of the NPN 20 and the drains of the PMOS's 22 and 23 are interconnected without the AL wires. The NPN 21 includes the N+region 40 in the isolation region 44 as the emitter, the P well 32 as the base and the outer periphery 45 of the P well 32 of the drain of the NMOS 26 as the collector. The P well 32 contains portions of the sources of the DPMOS's 28 and 29 so that the base of the NPN 21 and the sources of the DPMOS's 28 and 29 are interconnected without the AL wires. The P well 32 does not contain any portion of the drain of the NMOS 26 because the collector of the NPN 21 and the drain of the NMOS 26 are interconnected without the AL wire. The collector 39 of the NPN 20 and the sources of the PMOS's 22 and 23 are connected to the power supply by the VCC power supply line 42. The base of the NPN 20 and the drain of the DNMOS 24 are interconnected by the AL wire 46. The emitter 40 of the NPN 21 and the drains of the DPMOS's 28 and 29 are connected to the GND by the GND power supply line 43. The base of the NPN 21 and the source of the NMOS 27 are interconnected to the AL wire 47. The emitter of the NPN 20 (at the contact hole 41) and the collecter of the NPN 21 (at the contact hole 48) are interconnected by a second level AL wire (not shown) to form the output 20 2. The inputs 201 are the gate electrodes 37 and 38.

By using as many layout patterns of FIG. 10 as required and selecting the AL wiring layers and the contact layers for each logical gate, an inverter or a NAND circuit can be constructed. Thus, by arranging the basic cells of FIG. 10 without the AL wiring layer and the contact layer, in a manner shown in FIG. 18, the basic cell line of the gate array is constructed. Since the contact holes for allowing the connection of the source and drain regions of the DMOS's 24 and 25 to the AL wire and the contact holes for allowing the source and drain regions of the DPMOS's 28 and 29 to the AL wire are positioned at the center of the basic cell, the outer surfaces of the source and drain regions of the DNMOS's 24 and 25, the DPMOS's 28 and 29 can be used as the AL wiring regions. This is equivalent to bury the elements beneath the wiring region and a space efficiency is improved. In the present embodiment, the high density bipolar-CMOS hybrid logic circuit is attained and the high speed, low power consumption and high integration density bipolar-CMOS hybrid gate array LSI is provided.

Other embodiment of the present invention is explained below. FIG. 12 shows a two-input NAND circuit having a complementary output stage. The present NAND circuit comprises a PNP transistor 51, an NPN 21, PMOS's 22 and 23, DNMOS's 24 and 25, NMOS's 26 and 27 and DPMOS's 28 and 29. The like elements to those shown in FIG. 2 are designated by the like numerals. The operation is now explained. When either one of the inputs 52 is "0", either one of the PMOS's 22 and 23 is ON and either one of the NMOS's 26 and 27 is OFF and the ON-resistance of either one of the DPMOS's 28 and 29 decreases. Accordingly, the base potential of the PNP 51 drops and the PNP 51 is turned on and the NPN 21 is turned off because the base-emitter circuit is shorted by the DPMOS 28 or 29. Thus, the collector current of the PNP 51 charges up the load and the output 53 assumes the "1" level. When botch inputs 52 are "0", both PMOS 's 22 and 23 are ON and both NMOS's 26 and 27 are OFF and the ON-resistances of the DPMOS's 28 and 29 decrease. Accordingly, the operation is same as that described above and the output 53 assumes the "1" level. When both inputs 52 are "1", both PMOS's 22 and 23 are OFF and both NMOS's 26 and 27 are ON and the ON-resistances of the DNMOS's 24 and 25 decrease while the ON-resistances of the DPMOS 28 and 29 increase. Accordingly, the PNP 51 is turned off because the base-emitter circuit is shorted by the DNMOS's 24 and 25. Since the base-collector circuit of the NPN 21 is shorted by the NMOS's 26 and 27, the current from the output 53 is supplied to the base of the NPN 21 so that the NPN 21 is turned on and the output 53 assumes the "0" level.

FIG. 13 shows a layout pattern for constructing the bipolar-CMOS hybrid circuit, and FIG. 14 shows a sectional view thereof. FIG. 14 shows an inverter but the like elements are designated by the like numerals to those shown in FIG. 13. In FIG. 13, a pattern of the burid layer 50 of FIG. !4 is omitted for the sake of simplification. In the present embodiment, the PNP transistor 51 is a lateral transistor. The numerals for the MOS transistors corresponding to those of FIG. 12 are shown on the gate electrodes 37 and 38. The configuration of the MOS transistor and the NPN 21 is identical to that of FIG. 10. The PNP 51 is a lateral transistor and includes the P+region 62 as the emitter, the N region in the isolation region 60 as the base and the drain of the PMOS 22 (at the contact hole 63) as the collector. The P well 61 does not contain any portion of the source of the DNMOS 24 because the base of the PNP 51 and the source of the DNMOS 24 is interconnected without the AL wire. The emitter 62 of the PNP 51 and the drain of the DNMOS 25 are connected to the power supply by the VCC power supply line 42. The source of the DNMOS 24 and the sources of the PMOS's 22 and 23 are interconnected by the AL wire 64. The connections of the NMOS's 26 and 27, the DPMOS's 2S and 29 and the NPN 21 are identical to those of FIG. 10 and they are not explained here. The collector of the PNP 51 (at the contact hole 63) and the collector of the NPN 21 (at the contact hole 48) are connected by a second line AL wire (not shown) to form the output 53. The inputs 52 are the gate electrodes 37 and 38.

By using as many layout patterns of FIG. 13 as required and selecting the AL wiring layers and the contact layers for each logical gate, an inverter or a NAND circuit can he constructed. Accordingly, by arranging the basic cells of FIG. 13 without the AL wiring layer and the contact layer, in a manner shown in FIG. 18, a basic cell line of the gate array is constructed. In the present embodiment, a high speed, low power consumption and high integration density bipolar CMOS hybrid gate array LSI is provided.

FIG. 16 shows other embodiment of the present invention for constructing the two-input NAND circuit having the complementary output stage as shown in FIG. 15, and FIG. 17 shows a sectional view thereof. The operation of FIG. 15 is described first. When either one of the inputs 86 is "0", either one of the PMOS's 82 and 83 is ON and either one of the NMOS's 84 and 85 is OFF. Accordingly, the base potentials of the NPN 80 and the PNP 81 rise so that the NPN 80 is turned on and the PNP 81 is turned off. Thus, the emitter current of the NPN 80 charges up the load and the output 87 assumes the "1" level. When both inputs 86 are "0", both PMOS's 82 and 83 are ON and both NMOS's 84 and 85 are OFF. Accordingly, the operation is same as that described above and the output 87 assumes the "1" level. On the other hand, when both inputs 86 are "1", both PMOS's 82 and 83 are OFF and both NMOS's 84 and 85 are ON. Accordingly, the base potentials of the NPN 80 and the PNP 81 drop so that the NPN 80 is turned off and the PNP 81 is turned on and the output 87 assumes the "0" level. FIG. 16 shows a layout pattern for constructing the circuit of FIG. 15, and FIG. 17 shows a longitudinal structure thereof. FIG. 17 shows an inverter but the like elements are designated by the like numerals to those of FIG. 16. The numerals for the MOS transistors corresponding to those of FIG. 15 are shown on the gate electrodes 93 and 94 of FIG. 16. The P+region 91 and the gate electrodes 93 and 94 form the PMOS's 83 and 82, and the N+region 92 and the gate electrodes 93 and 94 form the NMOS's 84 and 85. The NPN 80 includes the N region 96 as the emitter, the P region 95 as the base and the N+region 99 as the collector. The PNP 81 includes the P+region 98 as the emitter, the N region 97 as the base and the P+region 100 as the collector. The sources of the PMOS's 82 and 83 and the collector 99 of the NPN 80 are connected to the power supply by the VCC power supply line 101. The drains of the PMOS's 82 and 83, the bases 95 and 97 of the NPN 80 and the PNP 81 and the drain of the NMOS 84 are interconnected by the AL wire 102. The collector 100 of the PNP 81 and the source of the NMOS 85 are connected to the GND by the GND power supply line 103. The emitter 96 o f the NPN 80 and the emitter 9 8 of the PNP 81 are interconnected by the AL wire 104 to form the output 87. The inputs 86 are the gate electrodes 93 and 94.

By using as many layout patterns of FIG. 16 as required and selecting the AL wiring layers and the contact layers for each logical gate, an inverter or a NAND circuit can be constructed. Accordingly, by arranging the basic cells of FIG. 16 without the AL wiring layer and the contact layer, in a manner shown in FIG. 18, the basic cell line of the gate array is constructed. In the present embodiment, since the isolation region is net necessary, a higher integration density gate array LSI is provided.

FIG. 20 shows an expansion of a cell pattern of the basic cell 302 of FIG. 18, and FIG. 21 shows a sectional view thereof. In FIGS. 20 and 21, the like elements are designated by the like numerals. In an N well 421 formed in a P type semiconductor substrate, a P+region 423 of a PMOS transistor and a collector region 424, a base region 425 and an emitter region 426 of an NPN bipolar transistor are formed. The PMOS transistor and the NPN bipolar transistor are formed in the same N well. It is used in a circuit which fixes the potential of the collector region 424 to the power supply voltage VCC so that the potential of the substrate (N well 421) of the PMOS transistor is fixed to the collector potential of the NPN bipolar transistor in order to improve the integration density. In the N well 422, the collector region 427, the base region 428 and the emitter region 429 of the NPN bipolar transistor are formed. It is used in a circuit in which the potential of the collector region 427 changes. The N well 421 and the N well 422 must be spaced from each other by a distance determined by a breakdown voltage in order to electrically isolate them by a P region 437 which is at the ground level. The P region 437 at the good potential corresponds to the substrate of the NMOS transistor. Thus, an N+region 430 of the NMOS transistor is formed between the N wells 4 21 and 422. Similarly, N+regions 431 and 432 of the NMOS transistor are formed. A P+region 433 is provided to fix the potential of the P region 437 to the ground level. Numerals 435 and 436 denote gate electrodes such as polysilicon of the PMOS transistor and the NMOS transistor and they serve as the input regions. So-called dog bones are formed at opposite ends of the gate electrodes 435 and 436 to allow contact to a first wiring such as a first level AL wire so that a signal can be inputted to the basic cell from either top or bottom of the channel region 304. Numeral 434 denotes a gate electrode for the two NMOS transistors. The output region is usually a collector region 427 formed in the N well 422, and the input regions 435 and 436 and the output region 427 are of the same dimension as a wiring pitch of a second wiring layer such as a second level AL wire which extends in a y-direction of FIG. 18 to allow design automation.

A first insulation film (not shown) is formed on the poly-Si wiring of the gate electrodes 435, 436 and 434, and a power supply wiring and a first AL wiring (not shown) are formed thereon in parallel to the basic cell line. The first wiring is used for wiring in the logic blocks and wiring of the logic blocks. When the poly-Si wiring 434 or the diffusion layer 423 and the first AL wiring are to be connected, a contact hole thereinafter simply referred to as a contact) is formed in the first insulation layer. A second insulation layer (not shown) is formed on the first wiring, and a second AL wiring is formed thereon orthogonally to the basic cell line. When the first wiring and the second wiring are to be connected, a contact hole (hereinafter referred to as a thru-hole) is formed in the second insulator layer. A third insulation layer is formed on the top to protect the transistors and the wirings. In a conventional gate array LSI, the first wiring layer and the second wiring layer and the second insulation layer having the thru-holes formed at desired positions to allow the connection of the first wiring and the second wiring are selected for each type to obtain a desired LSI. The first insulation layer having contacts formed to allow the connection of the first wiring and the poly-Si wiring and the diffusion layer may also be selected for each type.

By using the basic cell shown in FIG. 20, the logic circuits necessary to design the LSI can be constructed. Examples thereof are explained below.

FIG. 22 shows a bipolar-CMOS hybrid two-input NAND circuit. Numeral 450 denotes a first NPN bipolar transistor having a collector thereof connected to a power supply terminal 40 and an emitter thereof connected to an output terminal 443, numeral 451 denotes a second NPN bipolar transistor having a collector thereof connected to an output terminal 443 and an emitter thereof connected to a fixed potential terminal which is a ground potential, numerals 441 and 442 denote input terminals, numerals 444 and 445 denote first and second PMOS transistors having gates thereof connected to the input terminals 442 and 441, respectively, and sources and drains thereof connected in parallel between the collector and the base of the first NPN 450, numerals 446 and 447 denote first and second NMOS transistors having gates thereof connected to the input terminals 441 and 442, respectively, and drains and sources thereof connected in series between the collector and the base of the second NPN 451, numeral 448 denotes a third NMOS transistor having a gate thereof connected to the power supply terminal 440 and a drain and a source thereof connected to the base and the emitter, respectively, of the first NPN 450, and numeral 449 denotes a fourth NMOS transistor having a gate thereof connected to the power supply terminal 440 and a drain and a source thereof connected to the base and the emitter, respectively of the second NPN 451.

The logical operation of the circuit of FIG. 22 is identical to that of FIG. 2 and shown in Table 1.

When either one of the inputs 441 and 442 is "0", either one of the first and second PMOS 's 444 and 445 is ON and either one of the first and second NMOS 's 446 and 447 is OFF. Accordingly, the base potential of the first NPN 450 rises so that the first NPN 450 is turned on, and the second NPN 451 is turned off because the base-emitter circuit is shorted by the fourth NMOS 449 which is in the non-saturation region. Thus, the emitter current of the first NPN 450 charges up the load and the output 443 assumes the "1" level.

When both inputs 441 and 442 are "0", both first and second PMOS's 444 and 445 are ON and both first and second NMOS's 446 and 447 are OFF. Accordingly, the operation is same as that described above and the output 443 assumes the "1" level.

On the other hand, when both inputs 441 and 442 are "1+", both first and second PMOS's 444 and 445 are OFF and both first and second NMOS's 446 and 447 are ON. Accordingly, the first NPN 450 is turned off because the base-emitter circuit thereof is shorted by the third NMOS 448 which is in the non-saturation region, and the second NPN 451 is turned on because the collector-base circuit thereof is shorted by the first and second NMOS's 446 and 447 and the current from the output 443 is supplied to the base of the second NPN 451. Thus, the output 443 assumes the "0" level.

The third and fourth NMOS's 448 and 449 may be resistors.

FIG. 23 shows the two-input NAND circuit constructed by using the basic cells of FIG. 20. A symbol ⊠ indicates the contact, a broken line indicates the first wiring a symbol ⊡ indicates the thru-hole and a chain line indicates the second wiring. The like elements to those shown in FIG. 20 are designated by the like numerals. The numerals for the gate electrodes corresponding to those of FIG. 22 are designated.

The first wiring 452 which is the VCC power supply line is connected to the source of the second PMOS 445 by the contact 453, to the source of the first PMOS 444 by the contact 454, to the collector of the first NPN 450 by the contact 455 and to the gate electrodes of the third and fourth NMOS's 448 and 449 by the contact 456. The drains o f the firs t and second PMOS's 444 and 445, the base of the first NPN 450 and the drain of the third NMOS 448 are interconnected by the first wiring 457 and the contacts 459, 458 and 460. The emitter of the first NPN 450, The source of the third NMOS 448, the drain of the first NMOS 446 and the collector of the second NPN 45 1 are interconnected by the first wirings 461 and 462 and the contacts 463, 464, 465, 466 and 467. The emitter of the first NPN 450 and the collector of the second NPN 451 are interconnected by the second wiring 468 and the thru-holes 469 and 470. If the second wiring 468 is not present, a sheet resistance of the drain of the first NMOS 444 is inserted between the emitter of the first NPN 450 and the collector of the second NPN 451 and a speed is lowered. The second wiring 468 is, therefore, provided to prevent such a speed reduction. The second wiring 468 is on the grid of the second wiring extending in the y-direction to minimize the impedance to the design automation. The source of the second NMOS 447, the drain of the fourth NMOS 449 and the base of the second NPN 451 are interconnected by the first wiring 471 and the contacts 472, 473 and 474. The first wiring 475 which is the ground potential line is connected to the source of the fourth NMOS 449 and the emitter of the second NPN 451 by the contacts 476 and 477. The P substrate 437 is fixed to the ground potential by the contact 478.

As to the widths of the AL wires, the first wirings 452 and 475 which are the power supply lines are wide, and the first wirings 461 and 462 and the second wiring 468, through which the emitter currents, which are approximate $h_{FE}$ time s as large as the base currents, flow are wider than the first wirings 457 and 471 through which the base currents flow. The base wirings are narrowest of the process.

A pair of contacts are provided for each of the contacts 453, 454, 466 and 472 to reduce the contact resistances and reduce the sheet resistances of the sources or drains of the MOS transistors to obtain a higher speed. In this manner, the two-input NAND circuit is constructed.

FIG. 24 shows a sectional view of FIG. 23 which is the bipolar-CMOS hybrid two-input NAND circuit constructed in accordance with FIG. 22. The elements are designated by the numerals corresponding to those of FIG. 22. In FIG. 24, the wirings are added to the sectional view of FIG. 21 which is unwired. Therefore, no additional explanation will be necessary.

FIG. 25 shows an embodiment of the bipolar-CMOS hybrid two-input NOR circuit. Numeral 488 denotes a first NPN having a collector thereof connected to a power supply terminal 490 and an emitter thereof connected to an output terminal 481, numeral 489 denotes a second NPN having a collector thereof connected to the output terminal 481 and an emitter thereof connected to a fixed potential terminal which is a ground potential, numerals 479 and 480 denotes input terminals, numerals 482 and 48 3 denote first and second PMOS's having gates connected to the input terminals 479 and 480, respectively, and sources and drains thereof connected in series between the collector and the base of the first NPN 488, numerals 484 and 485 denote first and second NMOS's having gates thereof connected to the input terminals 479 and 480, respectively, and drains and sources thereof connected in parallel between the collector and the base of the second NPN 489, numeral 486 denotes a third NMOS having a gate connected to the power supply terminal 490 and a drain and a source thereof connected to the base and the emitter, respectively, of the first NPN 488, and numeral 487 denotes a fourth NMOS having a gate thereof connected to the power supply terminal 490 and a drain and a source thereof connected to the base and the emitter, respectively, of the second NPN 489.

Table 2 shows a logical operation of the present embodiment.

TABLE 2

| INPUTS 479, 480 | PMOS's 482, 483 | NMOS's 484, 485 | NPN 488 | NPN 489 | OUTPUT 481 |
|---|---|---|---|---|---|
| Both are "0". | Both are ON. | Both are OFF. | ON | OFF | "1" |
| Either one is "1". | Either one is OFF. | Either one is ON. | OFF | ON | "0" |
| Both are "1". | Both are OFF. | Both are ON. | OFF | ON | "0" |

When both inputs 479 and 480 are "0", both first and second PMOS's 482 and 483 are ON and both first and second NMOS's 484 and 485 are OFF. Accordingly, the base potential of the first NPN 488 rises so that the first NPN 488 is turned on. The second NPN 489 is turned off because the base-emitter circuit thereof is shorted by the fourth NMOS 487 which is in the non-saturation region. Thus, the emitter current of the first NPN 488 charges up the load and the output 481 assumes the "1" level.

When either one of the inputs 479 and 480 is "1", either one of the first and second PMOS's 482 and 483 is OFF and either one of the first and second NMOS's 484 and 485 is ON. Accordingly, the first NPN 488 is turned off because the base-emitter circuit thereof is shorted by the third NMOS 486 which is in the Non-saturation region. The base-collector circuit of the second NPN 489 is shorted by the first or second NMOS 484 or 485 which is now ON. Thus, the current from the output 481 is supplied to the base of the second NPN 489 so that the second NPN 489 is turned on and the output 481 assumes the "0" level.

When both inputs 479 and 480 are "1", both first and second PMOS's 482 and 483 are OFF and both first and second NMOS's 484 and 485 are ON. Accordingly the operation is same as that described above and the output 481 assumes the "0" level.

FIG. 26 shows the two-input NOR circuit constructed by the basic cells of FIG. 20. A symbol ⊠ indicates a contact, a broken line indicates a first wiring such as an AL wire, a symbol ⊠ indicates a thru-hole, and a chain line indicate a second wiring such as an AL wire. The like elements to those shown in FIG. 20 are not designated by the numerals because they were explained in FIG. 23. The numerals for the gate electrodes corresponding to those of FIG. 25 are designated. The contacts corresponding to those of FIG. 23 are designated by the like numerals.

The source of the first PMOS 482, the collector of the first NPN 488 and the gate electrodes of the third and fourth NMOS's 486 and 487 are connected to the VCC potential by the first wiring 452 which is the VCC power supply line and the contacts 454, 455 and 456. The drain of the second PMOS 483, the base of the first NPN 488 and the drain of the third NMOS 486 are interconnected by the first wiring 491 and the contacts 492, 458 and 460. The emitter of the first NPN 488, the source of the third NMOS 486, the drains of the first and second NMOS's 484 and 485 and the collector of the second NPN 489 are interconnected by the first wirings 494 and 496 and the contacts 463, 464, 493, 495 and 467. The emitter of the first NPN 488 and the collector of the second NPN 489 are interconnected by the second wiring 468 and the thru-holes 469 and 470. The second wiring 468 is provided by the same reason as that for the two-input NAND circuit described above. The sources of the first and second NMOS's 484 and 485, the drain of the fourth NMOS 487 and the base of the second NPN 489 are interconnected by the first wiring 497 and the contacts 466, 472, 473 and 474. The source of the fourth NMOS 487, the emitter of the second NPN 489 and the P substrate 437 are fixed to the ground potential by the first wiring 475 which is the ground potential line and the contacts 476, 477 and 478. In this manner, the two-input NOR circuit is constructed.

FIG. 27 shows an example of a bipolar-CMOS hybrid inverter which can be used as a basic cell in the present embodiment.

In FIG. 27 numeral 4107 denotes a first NPN having a collector thereof connected to a power supply terminal 4100 and an emitter thereof connected to an output terminal 499, numeral 4108 denotes a second NPN having a collector thereof connected to the output terminal 499 and an emitter thereof connected to a fixed potential terminal which is a ground potential, numerals 4101 and 4102 denote first and second PMOS's having gates thereof connected to an input terminal 498 and sources and drains thereof connected to the collector and the base, respectively, of the first NPN 4107, numerals 4103 and 4104 denote first and second NMOS's having gates thereof connected to the input terminal 498 and drains and sources thereof connected the collector and the base, respectively, of the second NPN 4108, numeral 4105 denotes a third NMOS having a gate thereof connected to the power supply terminal 4100 and a drain and a source thereof connected to the base and the emitter, respectively, of the first NPN 4107, and numeral 4106 denotes a fourth NMOS having a gate thereof connected to the power supply terminal 4100 and a drain and a source thereof connected to the base and the emitter, respectively, of the second NPN 4108.

Table 3 shows a logical operation of the present embodiment.

TABLE 3

| INPUT 498 | PMOS's 4101, 4102 | NMOS's 4103, 4104 | NPN 4107 | NPN 4108 | OUTPUT 499 |
|---|---|---|---|---|---|
| "0" | ON | OFF | ON | OFF | "1" |
| "1" | OFF | ON | OFF | ON | "0" |

When the input 498 is "0", the first and second PMOS's 4101 and 4102 are ON and the first and second NMOS's 4103 and 4104 are OFF. Accordingly, the base potential of the first NPN 4 107 rises so that the first NPN 4107 is turned on. The second NPN 4108 is turned off because the base-emitter circuit thereof is shorted by the fourth NMOS 4106 which is in the non-saturation region. Thus, the emitter current of the first NPN 4107 charges up the load and the output 499 assumes the "1" level. When the input 498 is "1", the first and second PMOS's 4101 and 4102 are OFF and the first and second NMOS's 4103 and 4104 are ON. Accordingly, the first NPN 4107 is turned off because the base-emitter circuit thereof is shorted by the third MOS 4105 which is in the non-saturation region. The base-collector circuit of the second NPN 4108 is shorted by the first and second NMOS's 4103 and 4104. Thus, the current from the output 499 is supplied to the base of the second NPN 4108 so that the second NPN 4108 is turned on and the output 499 assumes the "0" level. The third and fourth NMOS's 4105 and 4106 function as resistors. When the first and second NPN's are ON, they shunt fractions of the base currents, but when the first and second NPN's are OFF, they operate in the non-saturation region so that the drains and the sources are of the same potential and they serve to rapidly drain off the stored charges.

FIG. 28 shows the inverter constructed by the basic cells of FIG. 2C. A symbol ⊠ indicates a contact, a broken line indicates a first wiring, a symbol ⊡ indicates a thru-hole, and a chain line indicates a second wiring. The numerals for the elements corresponding to those of FIG. 27 are shown on the gate electrodes. The contacts corresponding to those in FIGS. 23 and 26 are designated by the like numerals.

The sources of the first and second PMOS's 4101 and 4102, the collector of the first NPN 4107 and the gate electrodes of the third and fourth NMOS's 4105 and 4106 are connected to the VCC potential by the first wiring 452 which is the VCC power supply line and the contacts 453, 454, 455 and 456. The drains of the first and second PMOS's 4101 and 4102, the base of the first NPN 4107 and the drain of the third NMOS 4105 are interconnected by the first wiring 457 and the contacts 459, 458 and 460. The emitter of the first NPN 4107, the source of the third NMOS 4105, the drains of the first and second NMOS's 4103 and 4104 and the collector of the second NPN 4108 are interconnected by the first wirings 494 and 496 and the contacts 463, 464, 493, 495 and 467. The emitter of the first NPN 4107 and the collector of the second NPN 4108 are interconnected by the second wiring 468 and the thru-holes 469 and 470, for the same reason as that described for the two-input NAND circuit. The sources of the first and second NMOS's 4103 and 4104, the drain of the fourth NMOS 4106 and the base of the second NPN 4108 are interconnected by the first wiring 497 and the contacts 466, 472, 473 and 474. The emitter of the second NPN 4108, the source of the fourth NMOS 4106 and the substrate 437 are fixed to the ground potential by the first wiring 475 which is the ground potential line and the contacts 477, 476 and 478. The gates of the first and second PMOS's 4101, 4102 and the first and second NMOS's 4103, 4104 are interconnected by the first wirings 4111 and 4 112 and the contacts 4109 and 4110. In this manner, the inverter is constructed. The methods for constructing the inverter, the two-input NAND circuit and the two-input NOR circuit have thus been described in detail a further characteristic of the basic cell patterns of FIGS. 20 to 28 is one or more internal wiring spaces formed on each side of the VCC power supply line or the ground potential line. These spaces are essential when a complex logic circuit is constructed by a number of basic cells.

When a complex logic circuit is constructed, it is sufficient that the NPN bipolar transistors are used only in the portions of the basic cells which are outputted to the wiring channels. Accordingly, when the adjacent basic cells are connected by the first wiring, the first wiring passes above the unused NPN bipolar transistors. Thus, the wiring after the first insulation layer having the contacts thereon may be changed for each type.

In the present embodiment, a pair of series-connected PMOS's and NMOS's are arranged for the two NPN bipolar transistors of the basic cell. Alternatively, three or four series-connected MOS transistors may be used, or a pair of one PMOS and one NMOS may be used.

FIG. 29 shows other embodiment of the basic cell 302 of FIG. 18. The like elements to those shown in FIG. 20 are designated by the like numerals. The difference from FIG. 20 resides in that the emitter region 426 of the NPN bipolar transistor in the N well 421 is positioned closely to the collector region 424. The emitter region 429 in the N well 422 is also positioned closely to the collector region 427. As a result, the collector resistance is reduced and the operation speed is increased. One or more dog bones for the contacts are provided in intermediate points between the opposite ends of the gate electrodes 435 and 436. This facilitates the construction of a complex logic gate. The base region 428 in the N well 422 is arranged vertically to reduce the x-direction size of the basic cell. This enables a higher integration density.

FIG. 30 shows the bipolar-CMOS hybrid two-input NAND circuit of FIG. 22 constructed by the basic cells of FIG. 29. A symbol ⊠ indicates the contact, a broken line indicates the first wiring, a symbol ⊡ indicates the thru-hole and a chain line indicates the second wiring. The like elements to those shown in FIG. 29 are designated by the like numerals. The numerals for the elements corresponding to those of FIG. 22 are shown on the gate electrodes.

The sources of the first and second PMOS's 444 and 445, the gate electrodes of the NMOS's 448 and 449 and the collector of the first NPN 450 are connected to the VCC potential by the first wiring 4113 which is the VCC power supply line and the contacts 4114, 4115, 4116 and 4117. The drains of the first and second PMOS's 444 and 445, the base of the first NPN 450 and the drain of the third NMOS 448 are interconnected by the first wiring 4118 and the contacts 4119, 4120 and 4121. The emitter of the first NPN 450, the drain of the first NMOS 446, the collector of the second NPN 451 and the source of the third NMOS 448 are interconnected by the first wirings 4122 and 4123 and the contacts 4124, 4125, 4126, 4127 and 4128. The emitter of the first NPN 450 and the collector of the second NPN 451 are interconnected by the second wiring 4129 and the thru-holes 4130 and 4131 by the same reason as that explained in FIG. 23. The source of the second NMOS 447, the drain of the fourth NMOS 449 and the base of the second NPN 451 are interconnected by the first wiring 4132 and the contacts 4133, 4134 and 4135. The emitter of the second NPN 451, the source of the fourth NMOS 449 and the P substrate 437 are fixed to the ground potential by the first wiring 4136 which is the ground potential line and the contacts 4137, 4138 and 4139. In this manner, the two-input NAND circuit is constructed.

The present embodiment provides a high speed and high integration density gate array LSI.

FIG. 31 shows a gate array LSI in accordance with other embodiment of the present invention.

Basic cell lines 511–517 are arranged on one main plane of a semiconductor substrate 10 in a y-direction with a predetermined space between the lines. The basic cell lines 511–517 each comprises alternate arrangement of a MOS array 521 and bipolar arrays 522, 523-l and 523-r.

The MOS array 521 comprises a plurality of MOS basic cells each including at least one MOS transistor, arranged in an x-direction. The bipolar arrays 522, 523-l and 523-r each comprises at least one bipolar basic cell including at least one bipolar transistor, arranged in the x-direction. Input/output pads, a peripheral circuit 524 including input/output circuits as shown in FIG. 19 and channels 541–548 which are primarily first level wiring regions are formed on the semiconductor substrate 10.

While not shown, wirings for the connection in each basic cell and interconnecting the basic cells through an insulation layer is formed on the semiconductor substrate 10. The MOS array 521 and the bipolar array 522, 523-l and 523-r (hatched areas) can be used as the y-direction second Level wiring channels.

FIGS. 32A and 32B show the MOS array 521 of FIG. 31. It comprises six MOS basic cells 535 arranged in the x-direction with each MOS basic cell 535 comprising a pair of PMOS transistors 531 and 532 having sources or drains thereof connected in series and a pair of NMOS transistors 533 and 534 having sources or drains thereof connected in series. Accordingly, in FIGS. 32A and 32B, each MOS array 521 includes 12 PMOS transistors and 12 NMOS transistors The MOS array 521 itself may be considered as a MOS basic cell.

FIGS. 33A and 33B show the bipolar array 522 of FIG. 31 constructed by four bipolar transistors and four resistors. The bipolar array 522 itself can be considered as a bipolar basic cell or the bipolar array 522 may be considered to comprise two-bipolar basic cells 645 and 646. The two sets of bipolar transistors 640, 642 and 641, 643 are arranged to allow either one of the MOS arrays 521 arranged on the left and right sides of the bipolar array 522 to use the bipolar array 522. The bipolar transistors 640, 641, 642 and 643 are of NPN type because the NPN transistor has a higher switching speed than a PNP transistor. In principle, the PNP transistors or a combination of the PNP and NPN transistors may be used. As shown in the plan view of FIG. 33A, the NPN bipolar transistors 640 and 641 have a common collector 6400 because the collectors of those transistors are connected to the power supply (VCC) and hence the number of contacts is reduced and the pattern size is reduced by the common collector. Registors 603 and 613 are connected between bases 601 and 611 and emitters 602 and 612 of the NPN bipolar transistors 640 and 64L, respectively.

Only the emitters of the NPN bipolar transistors 642 and 643 are grounded but they are separate because the emitters cannot be commonly formed in the integrated circuit device. The NPN bipolar transistors 642 and 643 include collectors 620 and 630, bases 621 and 631 and emitters 622 and 632, respectively, and resistors 623 and 633 are connected between the respective bases and emitters.

FIG. 34 shows another embodiment of the present invention.

In the present embodiment, a plurality of functional circuit blocks each including at least one logic gate, and at least one logic gate of at least one functional circuit block comprises a bipolar-MOS hybrid circuit.

In a preferred embodiment, the low power consumption and a high operation speed in a low load region of the CMOS circuit and a high speed and high load drive capability of the bipolar circuit are utilized. A portion or most portions of a circuit of the internal circuit of the functional circuit block which has a low load and operates at a high speed are constructed by the CMOS circuits, and a portion of the internal circuit which requires a high load drive capability because of the interconnection of the internal circuits and a portion of the functional circuit block which requires a high load drive capability because of the interconnection of the functional circuit blocks are constructed by bipolar-CMOS hybrid circuits having bipolar output stages.

In the present embodiment, the term "functional circuit block" includes not only a logic gate such as a NOT circuit, a NAND circuit or a NOR circuit, a combinational logic circuit which includes a plurality of logic gates to perform a desired logical operation and a sequential logic circuit such as a flip-flop, a counter or a shift register but also a logic gate used as an input buffer or an output buffer.

In FIG. 34A; numeral 2200 denotes a semiconductor chip on which block lines 2201-*a* to 2201-*c* are arranged. The block line 2201-*a* includes functional circuit blocks 2211, 2212, 2213 and 2214, the block line 2201-*b* includes functional circuit blocks 2221 and 2222, and the block line 2201-*c* includes functional circuit blocks 2231, 2232 and 2233. To construct the LSI by interconnecting those functional circuit blocks, the functional circuit block 2211 has outputs of logic gates constructed by the CMOS circuits and outputs of logic gates constructed by the bipolar-CMOS hybrid circuits so that the functional circuit blocks 2212 and 2221 which are closely positioned to each other are connected by the outputs of the logic gates constructed by the CMOS circuits through wirings 2251 and 2252, and the functional circuit blocks 2213, 2214, 2231 and 2232 which are located distantly are connected by the outputs of the bipolar-CMOS hybrid circuits through a wiring 2253. The functional circuit block 2233 includes only the CMOS circuit output and is connected to the functional circuit block 2232 through a wiring 2261 The functional circuit block 2232 includes only the bipolar-CMOS hybrid circuit output and is connected to a bonding pad 2270 through a wiring 2262.

An output shown by a symbol ▽ and a solid line is the output of the logic gate constructed by the CMOS circuit, and an output shown by the symbol ▽ and a broken line is the output of the logic gate constructed by the bipolar-CMOS hybrid circuit.

FIG. 34B shows the functional circuit block 2211 of FIG. 34A which receives external signals from the bonding pads 2201 and 2202, logically operates the signals and distributes an output to a plurality of internal functional circuit blocks, and the functional circuit blocks 2232 which receives the output 2253 of the functional circuit block 2211 and the output 2261 of the functional circuit block 2233, logically operates those outputs and supplies an output 2262 to an external through the bonding pad 2270. The functional circuit block 2211 receives the signals through the bonding pads 2201 and 2202, logically operates those signals and supplies one CMOS circuit output 2251 to the internal functional circuit block 2221. It also supplies the other CMOS circuit output 2252 to the functional circuit block 2212. It also supplies a bipolar-CMOS hybrid circuit output 2253 to the functional circuit blocks 2213, 2214 and 2231 and to the functional circuit block 2232. The functional circuit block 232 receives the output 2253 of the functional circuit block 2211 and the output 2261 of the functional circuit block 2233, logically operates those outputs, and supplies an output to an external of the chip by the bipolar-CMOS hybrid circuit output 2262 through the bonding pad 2270.

FIG. 35 shows a specific circuit of FIG. 34B. The functional circuit block 2211 comprises five circuit units, two-input NAND gates 2601, 2602 and 2603 and inverters 2604 and 2605. Of those, only the two-input NAND gate 2603 is constructed by the bipolar-CMOS hybrid circuit and other four circuits are constructed by the CMOS circuits.

The functional circuit block 2232 comprises one circuit unit, a two-input NOR gate 2606 which is constructed by the bipolar-CMOS hybrid circuit.

In the gate array described above, the CMOS circuit can be simply constructed by not using the bipolar transistor portion of the basic cell pattern.

FIG. 26 shows an embodiment of the circuit configuration of FIG. 25. PMOS transistors 2611 and 2612 and NMOS transistors 2613 and 2614 form the CMOS two-input NAND gate 2601 of FIG. 35. Similarly, PMOS transistors 2621 and 2622 and NMOS transistors 623 and 2624 form the CMOS two-input NAND gate 2602. PMOS transistors 2631 and 2632, NMOS transistors 2633 and 2634, NPN transistors 2635 and 2636 and resistors 2637 and 2638 form the bipolar-CMOS hybrid two-input NAND gate 2603. PMOS transistors 2661 and 2662, NMOS transistors 2663 and 2664, NPN transistors 2665 and 2666 and resistors 2667 and 2668 form the bipolar-CMOS hybrid two-input NOR gate 2606. Finally, a PMOS transistor 2641 and an NMOS transistor 2642 form the CMOS inverter 2604, and a PMOS transistor 2651 and an NMOS transistor 2652 form the CMOS inverter 2605.

FIG. 37 shows other embodiment of the present invention. As the integration density of the semiconductor integrated circuit device is improved and more circuits can be formed in one semiconductor chip, the interconnection of the circuits becomes more and more complex and longer. This causes a performance of the semiconductor integrated circuit to be deteriorated. A processing time of a computer for arranging and wiring the circuits also increases. Thus, one semiconductor chip is virtually divided into a plurality of sub-chips, the circuits are arranged and wired in each sub-chip, and then the sub-chips are interconnected to complete the semiconductor integrated circuit device. The present invention is very effective to such a semiconductor integrated circuit device constructed by the sub-chip units In FIG. 37, numerals 3300 denotes a semiconductor chip on which four sub-chips 3301-3304 are defined. Spaces between the sub-chips are assigned to wiring channels for interconnecting the sub-chips.

FIG. 38 shows an embodiment for constructing the sub-chip. The sub-chip includes 13 functional circuit blocks 3401-3413, three input terminals 3421-3423 and six output terminals 3431-3436. The functional circuit blocks 3402, 3405 and 3412 have only the CMOS circuit outputs, the functional circuit blocks 3403, 3404, 3406, 3407, 3409, 3411 and 3413 have only the bipolar-CMOS hybrid circuit outputs, and the functional circuit blocks 3401, 3408 and 3410 have both outputs. They are classified primarily by the load drive capability. The CMOS circuit output is used for a few fan-out circuit and a low load circuit having a short wiring length and the bipolar-CMOS hybrid circuit output is used for a heavy load circuit and a circuit connected to an output terminal of a combinational functional circuit block. In an actual design of the combinational functional circuit block, when the arrangement and the interconnection of the functional circuit blocks are to be manually designed, it is easy to select the CMOS circuit output or the bipolar-CMOS hybrid circuit output because the wiring length can be previously determined. However, when the arrangement and the wiring are to be done by the design automation using the computer, it is difficult to exactly predict the wiring length. In this case, it is necessary to use the bipolar-CMOS hybrid circuit outputs for most of the functional circuit blocks depending on the size and the complexity of the combinational functional circuit blocks. Even in such a case, since the internal circuit of the functional circuit block, except the output circuit, is constructed by the CMOS circuit, the increase of the area due to the incorporation of the bipolar transistor is minimized.

As described herein above, according to the present embodiment, the low power consumption and the high speed operation for the low load of the CMOS circuit and the high load drive capability of the bipolar circuit are utilized and the bipolar-CMOS hybrid circuit is used as required for the circuit of the functional circuit block. Thus, the high speed and low power consumption LSI is attained with the minimum increase of the chip area. The present invention is effective to the manual arrangement and wiring of the LSI, and particularly useful to the design automation by the computer where the wiring length differs from signal to signal.

As described hereinabove, the present invention provides the low power consumption and high speed semiconductor integrated circuit device.

We claim:

1. A semiconductor integrated circuit comprising:
A) an NPN type bipolar transistor having a collector connected to a first potential and an emitter connected to an output terminal;
B) a p-type FET having a gate connected to an input terminal, and a source and a drain connected to the collector and a base of said NPN type bipolar transistor, respectively;

C) a pull-down circuit having a first terminal connected to the output terminal, a second terminal connected to a second potential, and a third terminal connected to the input terminal, thereby operating in a manner complementary to said NPN type bipolar transistor;

D) at least one second FET connected between the base and the emitter of said NPN type bipolar transistor, and having a gate connected to either one of the first potential and the second potential.

2. A semiconductor integrated circuit according to claim 1, wherein said second FET is a p-type FET having the gate connected to the second potential.

3. A semiconductor integrated circuit according to claim 1, wherein said second FET is an n-type FET having the gate connected to the first potential.

4. A semiconductor integrated circuit according to claim 1, wherein said second FET includes a p-type FET having the gate connected to the second potential and an n-type FET having the gate connected to the first potential.

5. A semiconductor integrated circuit according to claim 1, further comprising an n-type FET connected to the base of said NPN bipolar transistor.

6. A semiconductor integrated circuit comprising:
A) an NPN type bipolar transistor having a collector connected to a first potential and an emitter connected to an output terminal;
B) a first p-type FET having a gate connected to an input terminal, and a source and a drain connected to the collector and a base of said NPN type bipolar transistor, respectively;
C) a pull-down circuit having a first terminal connected to the output terminal, a second terminal connected to a second potential, and a third terminal connected to the input terminal, thereby operating in a manner complementary to said NPN type bipolar transistor;
D) at least one second p-type FET connected between the base and the emitter of said NPN type bipolar transistor.

7. A semiconductor integrated circuit according to claim 6, further comprising an n-type FET connected to the base of said NPN bipolar transistor.

8. A semiconductor integrated circuit according to one of claims 1 through 7, wherein said pull-down circuit comprises a second bipolar transistor having a collector connected to the output terminal and an emitter connected to the second terminal, and a second n-type FET having a gate connected to the input terminal, a drain and a source connected to the collector and the base of said second NPN bipolar transistor, respectively.

9. A semiconductor integrated circuit comprising:
A) a first NPN type bipolar transistor having a collector connected to a first potential and an emitter connected to an output terminal;
B) a first p-type FET having a gate connected to an input terminal, and a source and a drain connected to the collector and a base of said first NPN type bipolar transistor; respectively;
C) a second NPN type bipolar transistor having a collector connected to the output terminal and an emitter connected to a second potential;
D) a first n-type FET having gate connected to the input terminal, and a source and a drain connected between the collector and a base of said second NPN type bipolar transistor;
E) a second n-type FET having a gate connected to the first potential, and a drain and a source connected between the base and the emitter of said second NPN type bipolar transistor.

10. A semiconductor integrated circuit according to claim 1, 6 or 9, wherein said first potential is a positive potential and said second potential is a ground potential.

11. A semiconductor integrated circuit according to claim 1, 6 or 9, wherein said semiconductor integrated circuit does not include resistors so that an output level at said output terminal will be at either said first potential or said second potential.

12. A semiconductor integrated circuit according to claim 10, wherein said semiconductor integrated circuit does not include resistors so that an output level at said output terminal will be at either said first potential or said second potential.

* * * * *